(12) United States Patent
Itonaga et al.

(10) Patent No.: US 7,033,874 B2
(45) Date of Patent: Apr. 25, 2006

(54) METHOD OF FORMING INSULATING FILM AND METHOD OF FABRICATING SEMICONDUCTOR DEVICE INCLUDING PLASMA BIAS FOR FORMING A SECOND INSULATING FILM

(75) Inventors: Kazuichiro Itonaga, Osaka (JP); Akihiro Yamamoto, Kyoto (JP); Hiroaki Nakaoka, Kyoto (JP); Isao Miyanaga, Nara (JP); Yoshinao Harada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 44 days.

(21) Appl. No.: 10/863,285

(22) Filed: Jun. 9, 2004

(65) Prior Publication Data

US 2004/0224450 A1 Nov. 11, 2004

Related U.S. Application Data

(62) Division of application No. 09/662,004, filed on Sep. 14, 2000, now Pat. No. 6,800,512.

(30) Foreign Application Priority Data

Sep. 16, 1999 (JP) ................................. 11-261876

(51) Int. Cl.
*H01L 21/336* (2006.01)
*H01L 21/8234* (2006.01)
*H01L 21/302* (2006.01)
*H01L 21/461* (2006.01)
*H01L 21/31* (2006.01)

(52) U.S. Cl. ....................... 438/197; 438/711; 438/788; 438/792

(58) Field of Classification Search ................ 438/197, 438/711, 788, 792
See application file for complete search history.

(56) References Cited

U.S. PATENT DOCUMENTS

| 4,442,591 A | 4/1984 | Haken |
| 4,915,777 A | 4/1990 | Jucha et al. |

(Continued)

FOREIGN PATENT DOCUMENTS

EP 0-661-732 A2 5/1985

(Continued)

OTHER PUBLICATIONS

European Search Report.

(Continued)

*Primary Examiner*—William M. Brewster
(74) *Attorney, Agent, or Firm*—Nixon Peabody LLP; Donald R. Studebaker

(57) ABSTRACT

With keeping an atmosphere including oxygen within a chamber and with a wafer kept at a low temperature, plasma generated within the chamber is biased toward the wafer, and the wafer is subjected to the plasma. A semiconductor layer exposed on the wafer is oxidized into an oxide film. Thus, an oxide film can be formed even at room temperature differently from thermal oxidation. This oxidation is applicable to recovery of an implantation protection insulating film having been etched in cleaning a photoresist film, relaxation of a step formed between polysilicon films, relaxation of a step formed within a trench and the like. Also, before removing a photoresist film used for forming a gate electrode including a metal, a contamination protection film can be formed by this oxidation with the photoresist film kept.

4 Claims, 25 Drawing Sheets

U.S. PATENT DOCUMENTS

| | | | |
|---|---|---|---|
| 5,366,586 A | 11/1994 | Samukawa | |
| 5,668,035 A * | 9/1997 | Fang et al. | 438/239 |
| 5,674,783 A | 10/1997 | Jang et al. | |
| 5,918,119 A * | 6/1999 | Huang | 438/238 |
| 5,943,565 A | 8/1999 | Ju | |
| 6,242,350 B1 * | 6/2001 | Tao et al. | 438/690 |
| 2001/0048980 A1 | 12/2001 | Kishimoto et al. | |
| 2003/0141343 A1 | 7/2003 | Murakami | |

FOREIGN PATENT DOCUMENTS

| | | |
|---|---|---|
| EP | 1 153 694 | 11/2001 |
| EP | 1 291 115 | 3/2003 |
| JP | 63-90138 | 4/1988 |
| JP | 5-19296 | 1/1993 |
| JP | 7-115204 | 5/1995 |
| JP | 7-131023 | 5/1995 |
| JP | 11-121448 | 4/1999 |
| WO | WO 98/04381 | 2/1998 |

OTHER PUBLICATIONS

Notice of Reasons of Rejection (Dated Apr. 1, 2003).

* cited by examiner

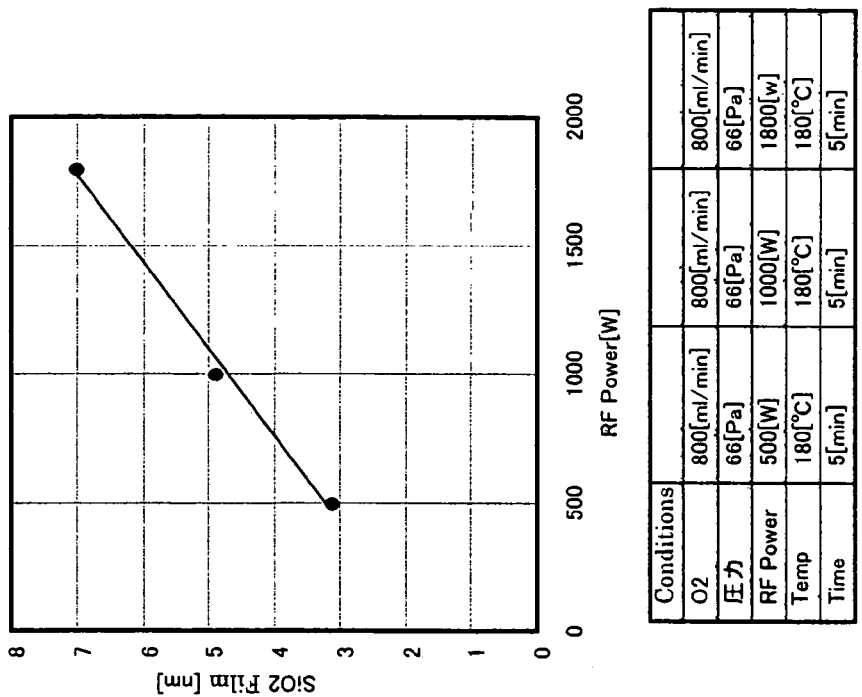
Fig.2(b) Dependency of film thickness on bias
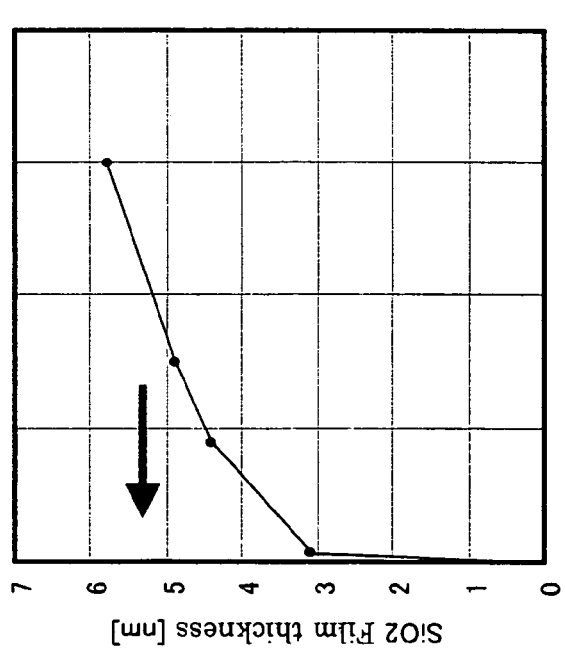
Fig.2(a) Dependency of film thickness on plasma time

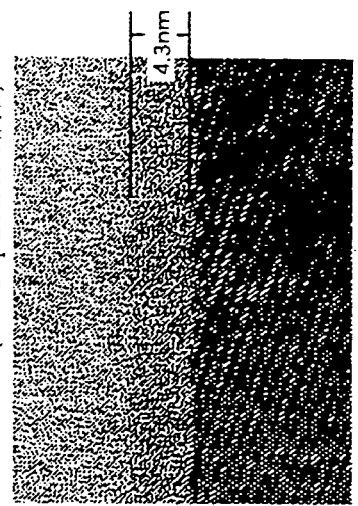
Fig. 8(c) sl.23 (No implantation) 66pa/800mtorr/180°C/3min
4.3nm
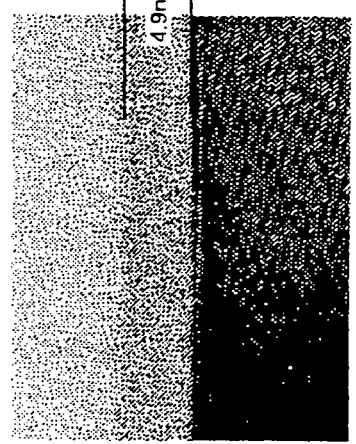
Fig. 8(b) sl.22 (Pch)
4.9nm
Fig. 8(a) sl.21 (Nch)
4.5nm
On Si substrate
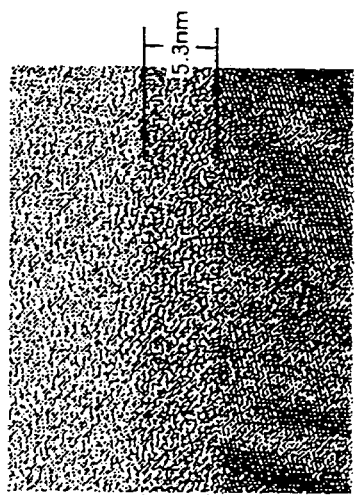
Fig. 8(e)
5.3nm
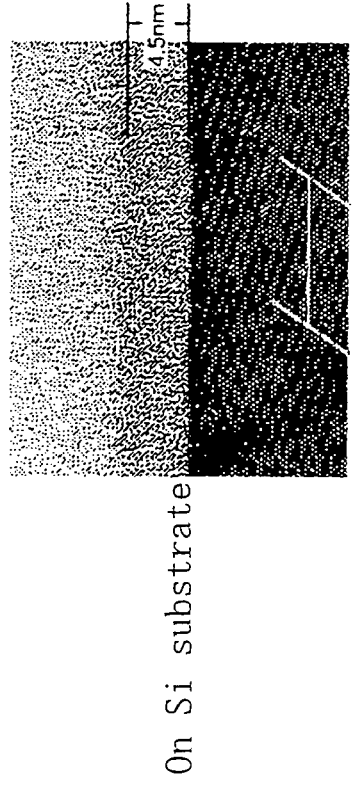
Fig. 8(d)
4.7nm
On polysilicon
10nm (1) No plasma oxidation  (2) With plasma oxidation

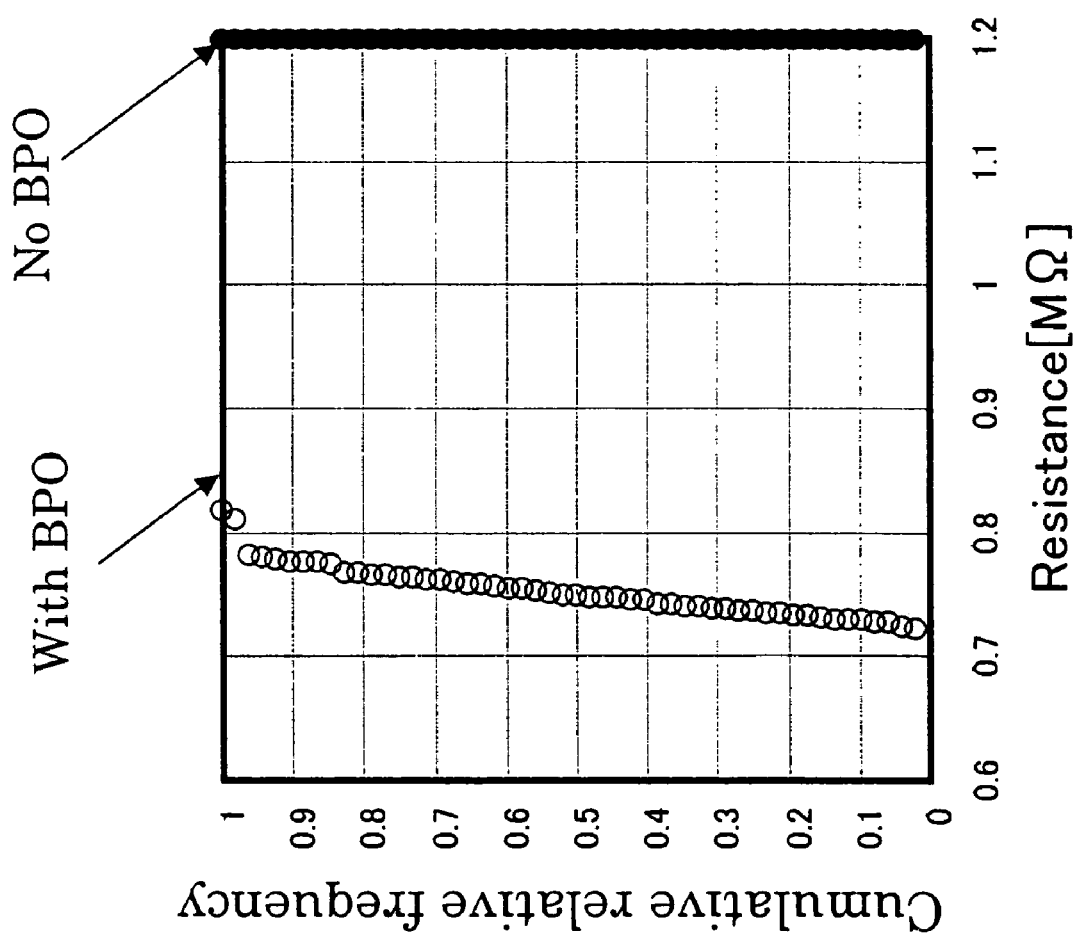

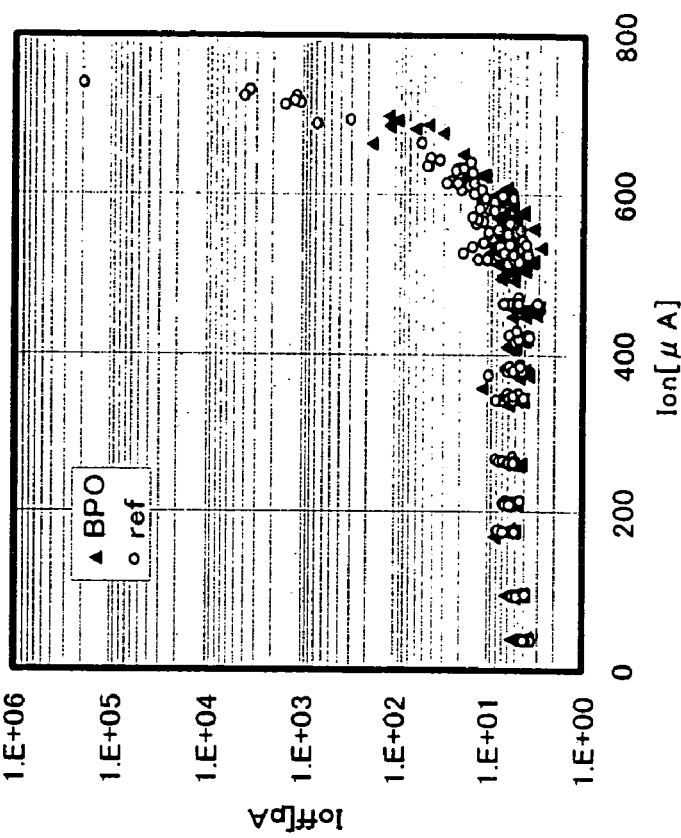
Fig.19(b) Nch Transistor
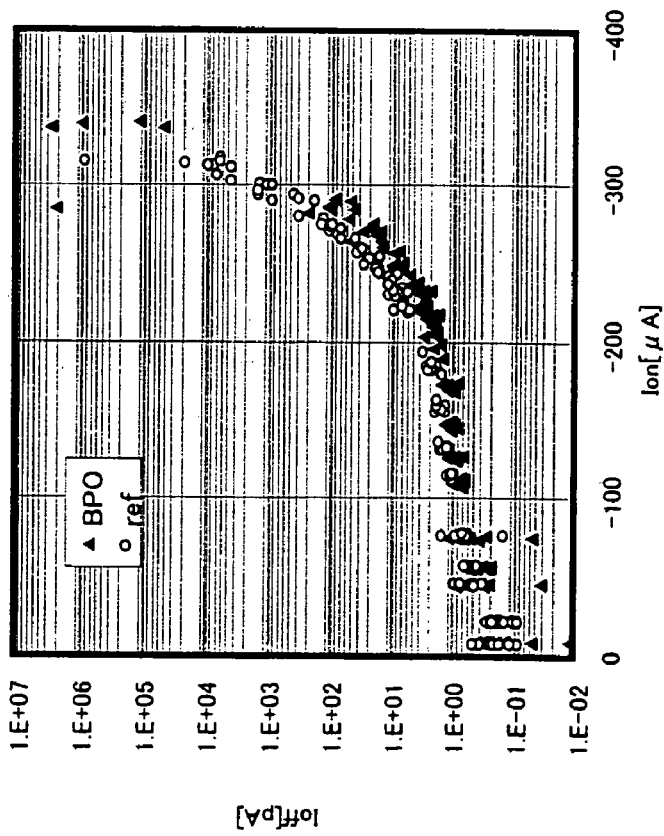
Fig.19(a) Pch Transistor

US 7,033,874 B2

METHOD OF FORMING INSULATING FILM AND METHOD OF FABRICATING SEMICONDUCTOR DEVICE INCLUDING PLASMA BIAS FOR FORMING A SECOND INSULATING FILM

BACKGROUND OF THE INVENTION

The present invention relates to a method of forming an insulating film in which a highly reliable oxide film can be formed at a low temperature and a method of fabricating a semiconductor device by utilizing the method of forming an insulating film.

In accordance with recent demands for high integration of semiconductor integrated circuits, for example, a very shallow junction structure is employed in forming a transistor and an STI (shallow trench isolation) structure is employed in forming an isolation. Since the very shallow junction structure and the STI are thus employed, dislocation defects are caused in an active region due to stress collected on the edge of the STI during formation of a gate oxide film (by thermal oxidation). As a result, junction leakage can be increased, or variation in the threshold voltage can be increased owing to change of junction profile caused in the formation of the gate oxide film. Therefore, in order to overcome these problems, it is very significant to conduct the process for forming an oxide film at a low temperature.

Also, in accordance with the demands for high integration of semiconductor integrated circuits, the gate length of a MOSFET is reduced, which makes it difficult to suppress the short channel effect. Therefore, the short channel effect is suppressed by employing a gate electrode structure designated as a dual gate electrode obtained by implanting phosphorus ions into a polysilicon film for a gate electrode of an NMOSFET and implanting boron ions into a polysilicon film for a gate electrode of a PMOSFET.

FIGS. 21(a) through 21(d) and 22(a) through 22(d) are sectional views for showing procedures in fabrication of a conventional CMOS device having a trench isolation structure and a dual gate electrode structure.

First, in the procedure shown in FIG. 21(a), a trench isolation region 101 is formed in a Si substrate 100, and then, a photoresist film 103 covering an NMOSFET formation region Rn and having an opening on a PMOSFET formation region Rp is formed on a protection oxide film 102 by photolithography. Thereafter, phosphorus ions (P$^+$) for forming an N-type well region 104, phosphorus ions (P$^+$) for controlling a threshold voltage and arsenic ions (As$^+$) for stopping punch-through are implanted into a region of the Si substrate 100 within the opening of the photoresist film 103 (namely, the PMOSFET formation region Rp).

Then, in the procedure shown in FIG. 21(b), the photoresist film 103 is removed by ashing and RCA cleaning.

Next, in the procedure shown in FIG. 21(a), a photoresist film 105 covering the PMOSFET formation region Rp and having an opening on the NMOSFET formation region Rn is formed on the protection oxide film 102 by the photolithography. Thereafter, boron ions (B$^+$) for forming a P-type well region 106, boron ions (B$^+$) for controlling a threshold voltage and boron ions (B$^+$) for stopping punch-through are implanted into a region of the Si substrate 100 within the opening of the photoresist film 105 (namely, the NMOSFET formation region Rn).

Then, in the procedure shown in FIG. 21(d), the photoresist film 105 is removed by the ashing and the RCA cleaning, and the protection oxide film 102 is also removed. Thereafter, the Si substrate 100 is heated at approximately 800 through 1000° C. in an oxygen atmosphere, thereby forming gate oxide films 107a and 107b on the N-type well region 104 and the P-type well region 106, respectively.

Subsequently, in the procedure shown in FIG. 22(a), after depositing a polysilicon film 108 for a gate electrode on the substrate, a photoresist film 109 covering the NMOSFET formation region Rn and having an opening on the PMOSFET formation region Rp is formed on the polysilicon film 108. Thereafter, boron ions (B$^+$) are implanted into a region of the polysilicon film within the opening of the photoresist film 109 (namely, the PMOSFET formation region Rp).

Similarly, in the procedure shown in FIG. 22(b), after removing the photoresist film 109 by the ashing and the RCA cleaning, a photoresist film 110 covering the PMOSFET formation region Rp and having an opening on the NMOSFET formation region Rn is formed on the polysilicon film 108 by the photolithography. Thereafter, phosphorus ions (P$^+$) are implanted into a region of the polysilicon film 108 within the opening of the photoresist film 110 (namely, the NMOSFET formation region Rn).

Next, in the procedure shown in FIG. 22(c), the photoresist film 110 is removed by the ashing and the RCA cleaning, and then, a heat treatment is carried out for activating the impurities implanted into the polysilicon film 108. In this manner, a P-type polysilicon film 108p is formed in the PMOSFET formation region Rp and an N-type polysilicon film 108n is formed in the NMOSFET formation region Rn.

Then, the P-type polysilicon film 108p and the N-type polysilicon film 108n are respectively patterned into a gate electrode 108a of the PMOSFET and a gate electrode 108b of the NMOSFET.

Furthermore, in order to cope with reduction in a chip area and high operation speed of a device, the resistance of the gate electrode of a MOSFET has recently been lowered. As one of promising means for lowering the resistance, the so-called polymetal gate structure or polycide gate structure in which part of the gate electrode is formed from a metal (refractory metal or its silicide) is known.

FIGS. 23(a) through 23(d) are sectional views for showing procedures in fabrication of a conventional CMOS device having the polymetal structure.

First, through the same procedures as those shown in FIGS. 21(a) through 21(d), a trench isolation region 101 for isolating a PMOSFET formation region Rp and an NMOSFET formation region Rn from each other, an N-type well region 104, a P-type well region 106 and gate oxide films 107a and 107b are formed in a Si substrate 100. Thereafter, as is shown in FIG. 23(a), a polysilicon film 120, a metal film 121 of titanium silicide or the like and an insulating film 122 of a silicon nitride film or the like are successively deposited on the substrate.

Next, in the procedure shown in FIG. 23(b), a photoresist film 115 covering a gate electrode formation region is formed by the photolithography, and then, dry etching (anisotropic etching) is carried out by using the photoresist film as a mask, thereby patterning the insulating film 122, the metal film 121 and the polysilicon film 120. In this manner, a gate electrode 125a including a bottom gate electrode 120a and a top gate electrode 121a, and an over-gate protection film 122a are formed in the PMOSFET formation region Rp. Also, a gate electrode 125b including a bottom gate electrode 120b and a top gate electrode 121b, and an over-gate protection film 122b are formed in the NMOSFET formation region Rn.

Then, in the procedure shown in FIG. 23(c), a photoresist film 116 covering the NMOSFET formation region Rn and having an opening on the PMOSFET formation region Rp is formed on the substrate. Thereafter, boron ions (B+) are implanted into the Si substrate 100 by using the photoresist film 116 and the gate electrode 125*a* as masks, thereby forming source/drain regions 126 of the PMOSFET.

Next, in the procedure shown in FIG. 23(*d*), the photoresist film 116 is removed by the ashing and the RCA cleaning, and then, a photoresist film (not shown) covering the PMOSFET formation region Rp and having an opening on the NMOSFET formation region Rn is formed on the substrate. Thereafter, arsenic ions (As+) are implanted into the Si substrate 100 by using the photoresist film and the gate electrode 125*b* as masks, thereby forming source/drain regions 127 of the NMOSFET. Then, the photoresist film is removed by the ashing and the RCA cleaning.

The conventional semiconductor devices fabricated as described above have, however, the following problems:

First, as is shown in FIG. 22(*d*), the gate oxide film 107*a* of the PMOSFET and the gate oxide film 107*b* of the NMOSFET have different thicknesses. This is because, in the thermal oxidation for forming the gate oxide films in the procedure of FIG. 21(*d*), the oxidizing rate is higher in the portion of the protection oxide film 102 corresponding to the NMOSFET formation region Rn where the boron ions are implanted than in the portion thereof corresponding to the PMOSFET formation region Rp where the phosphorus (or arsenic) ions are implanted. Also, since the impurity concentration profile in the P-type well region 106 for controlling the threshold voltage of the NMOSFET and the impurity concentration profile in the N-type well region 104 for controlling the threshold voltage of the PMOSFET are changed in the heat treatment conducted at 850 through 1000° C., the short channel effect of the MOSFETs are accelerated, variation in the threshold voltage of the NMOSFET and the PMOSFET is increased, and an off leakage current is increased.

Secondly, the boron implanted into the P-type polysilicon film 108*p* of the polysilicon film 108 for the gate electrode is diffused into the N-type well region 104 through the gate oxide film 107*a* due to the heat treatment conducted at 900 through 1000° C. for the thermal oxidation. As a result, the reliability of the gate oxide film is degraded, and variation in the threshold voltage of the PMOSFET is increased.

Thirdly, as is shown in FIG. 21(*b*), when the photoresist film 103 is removed by the ashing and the RCA cleaning after the ion implantation, the surface of the protection oxide film 102 becomes very rough. This is probably because the protection oxide film 102 is damaged by the ions during the ion implantation and is ununiformly etched by the RCA cleaning. When the ion implantation for forming the well region, namely, for controlling the threshold voltage, is carried out with the protection oxide film 102 having a very rough surface, the impurity concentration in a portion corresponding to a channel region within the well region is largely varied among MOSFETs. In this manner, variation in the threshold voltage among the MOSFETs is increased. Furthermore, the Si substrate 100 is also etched by the RCA cleaning. For example, when the RCA cleaning is carried out with the ion-implanted Si substrate exposed, a portion of the Si substrate 100 where the impurity ions have been implanted for controlling threshold voltage may also be etched by a thickness of several nm. As a result, the concentration profile of the implanted impurity is changed, so that the threshold voltage is largely varied in, particularly, a MOSFET having a buried transistor structure.

Fourthly, as is shown in FIG. 22(*d*), in patterning the polysilicon film 108 into the gate electrodes 108*a* and 108*b*, the surface of the active region of the Si substrate 100 can be roughened. Even when the etching end point of the polysilicon film is detected, the polysilicon film is not completely removed but partly remains as etching residues or sidewalls. Therefore, in order to remove the remaining portions of the polysilicon film, the polysilicon film is over-etched. Due to recent decrease in the thickness of a gate oxide film (to several nm), however, merely a portion of the gate oxide film not covered with the polysilicon film can be etched before completely removing the polysilicon film through the over-etching. Accordingly, when the Si substrate 100 below is partly etched, the surface of the active region is roughened. As a result, a good silicide layer cannot be formed in a salicidation process. Furthermore, the profile of the implanted ions for forming the source/drain regions cannot be uniform, resulting in increasing junction leakage.

Fifthly, as is shown in FIG. 23(*d*), in removing the photoresist film 116 by the ashing and the RCA cleaning after patterning the metal film 121, the top electrodes 121*a* and 121*b*, which are made from a metal in the gate electrodes 125*a* and 125*b* of the MOSFETS, are etched on their side faces. When metal ions dissolved in the etching solution (cleaning solution) enter the active region through the surface of the Si substrate 100, junction leakage is caused in the MOSFET. On the other hand, when a thermal oxide film for covering the substrate surface is formed to prevent this contamination, the top electrodes 121*a* and 121*b* formed from the metal are peeled.

Sixthly, as is shown in FIG. 22(*b*), in removing the photoresist films 109 and 110 by the ashing and the RCA cleaning or in conducting cleaning before loading the substrate in a furnace, the polysilicon film 108 is etched to some extent. Since the P-type polysilicon film 108*p* where the boron ions are implanted and the N-type polysilicon film 108*n* where the phosphorus (or arsenic) ions are implanted have different etch rates, there may be a step on the boundary between the P-type polysilicon film 108*p* and the N-type polysilicon film 108*n*. When this step is abrupt, although no problem can be observed in the sectional view shown in FIG. 22(*d*), the following problem may occur in a CMOS inverter having a silicide gate structure:

FIGS. 24(*a*) through 24(*c*) are sectional views in a silicidation process for showing the gate electrodes 108*a* and 108*b* alone taken on line perpendicular to the section of FIG. 22(*d*) (namely, line XXIV—XXIV of FIG. 25). Furthermore, FIG. 25 is a plan view of the gate electrodes and a portion below the gate electrodes of the CMOS inverter. In this manner, in the CMOS inverter, the gate electrodes of the PMOSFET and the NMOSFET are mutually connected in the section perpendicular to the section of FIG. 22(*d*).

In the case where the abrupt step as shown in FIG. 24(*a*) is present, even when, for example, a Co film is deposited on the gate electrodes 108*a* and 108*b* for forming a silicide film on the gate electrodes 108*a* and 108*b* in a later procedure, the Co film cannot be sufficiently deposited on the side face of the step.

As a result, as is shown in FIG. 24(*c*), merely a very thin silicide film of $CoSi_2$ or the like is formed or no silicide film is formed on the step through the silicidation. Accordingly, even when a voltage is applied to the gate electrode 108*b* of the NMOSFET in the CMOS inverter, the resistance between the gate electrodes can be too large to transfer the electric field to the gate electrode 108*a* of the PMOSFET.

Seventhly, the following problem occurs in forming the STI structure (trench isolation region). FIG. 26 is a sectional view for showing the shape of a conventional trench isolation region. As is shown in FIG. 26, a pad oxide film 131 and a masking nitride film 132 are stacked on a Si substrate 100, and a portion of the Si substrate 100 below an opening of the masking nitride film 132 is etched so as to form a trench 134. Then, a thermal oxide film 135 is formed by thermally oxidizing a portion of the Si substrate 100 within the trench, and the trench is filled with a CVD oxide film, so as to form a trench isolation region 136.

The thickness of the thermal oxide film 135 is, however, varied at respective edges within the trench depending upon the thickness of the masking nitride film 132, the thickness of the pad oxide film 131 or the plane size of the masking nitride film 132. In particular, when a hone phenomenon in which the thermal oxide film 135 has a small thickness at an edge is caused, an abrupt edge is formed at the corresponding corner of the Si substrate 100 within the trench 134. As a result, the electric filed is collected on the edge so as to cause problems such as breakdown of a gate insulating film and a hump characteristic (actuation of an edge transistor). The hone characteristic is conspicuous particularly when the thermal oxide film 135 is formed at a low temperature of 900° C. or less. Therefore, the temperature of the thermal oxidation can be set to 1000° C. for avoiding the hone phenomenon, but as the temperature of the thermal oxidation increases, larger stress is caused in the nitride film 132, resulting in increasing defects occurring in the Si substrate 100.

SUMMARY OF THE INVENTION

An object of the invention is, in considering that the aforementioned problems are basically derived from a high temperature required for forming an oxide film through thermal oxidation, providing means for forming an oxide film through oxidation conducted at a low temperature, so as to provide a method of forming an insulating film and a method of fabricating a semiconductor device in which the aforementioned problems can be overcome.

In order to overcome the problems, an oxide film or a nitrided oxide film is formed at a low temperature by utilizing biased plasma in this invention.

The method of this invention of forming an insulating film for a semiconductor device for forming, on a semiconductor layer exposed on a substrate, the insulating film through a reaction between at least oxygen and a semiconductor, comprises the steps of (a) loading the substrate including the semiconductor layer in a processing chamber; and (b) generating, within the processing chamber, plasma biased toward the substrate with the processing chamber kept in an atmosphere including oxygen, and subjecting the semiconductor layer to the biased plasma.

In this method, an insulating film can be formed through oxidation of a semiconductor using plasma and conducted at a temperature lower than in thermal oxidation. Accordingly, by utilizing this characteristic, insulating films functioning as various members of a semiconductor device can be formed while avoiding the problems such as the characteristic degradation derived from subjecting the substrate to a high temperature.

In the method of forming an insulating film, a thickness of the insulating film can be controlled by adjusting magnitude of a degree of biasing the plasma in the step (b).

In the method of forming an insulating film, the step (b) is preferably carried out at a temperature of 300° C. or less.

In the method of forming an insulating film, the step (b) is more preferably carried out at a temperature of 200° C. or less.

In the method of forming an insulating film, the step (b) can be carried out with a photoresist film formed on the substrate.

In the method of forming an insulating film, the insulating film can be used as a gate insulating film of a MIS transistor.

The method of forming an insulating film can further comprise, before at least the step (b), a step of forming a first active region doped with an impurity of a first conductivity type and a second active region doped with an impurity of a second conductivity type, and a first insulating film and a second insulating film can be respectively formed on the first active region and the second active region in the step (b). In this manner, differently from the thermal oxidation, the first insulating film and the second insulating film can be formed in substantially the same thickness.

The method of forming an insulating film can further comprise, after the step (b), a step of conducting a heat treatment on the insulating film. In this manner, the insulating film can be made in uniform quality and carbon contamination thereon can be removed, resulting in improving the reliability of the insulating film.

In the method of forming an insulating film, the step (b) can be carried out in an atmosphere including nitrogen and oxygen, in an atmosphere including a NO gas (a nitriding oxidation atmosphere), or in an atmosphere including oxygen and $N_2$ (a nitriding oxidation atmosphere). In this case, a nitrided oxide film is formed.

Alternatively, when the step (b) is carried out in an atmosphere including $O_2$ but substantially no nitrogen, an oxide film is formed.

The first method of fabricating a semiconductor device of this invention comprises the steps of (a) forming an insulating film on first and second active regions of a semiconductor substrate; (b) forming a first photoresist film covering the second active region and having an opening on the first active region; (c) implanting impurity ions into the first active region through the first photoresist film; (d) removing the first photoresist film; (e) recovering a thickness of the insulating film by subjecting, in an atmosphere including oxygen, the semiconductor substrate to plasma biased toward the semiconductor substrate; (f) forming a second photoresist film covering the first active region and having an opening on the second active region; and (g) implanting impurity ions into the second active region through the second photoresist film.

In this method, although the insulating film is also etched to cause variation in its thickness by the ion implantation and the ashing and cleaning conducted for removing the first photoresist film in the step (d), the thickness of the insulating film is recovered to a substantially uniform thickness by the bias plasma oxidation conducted in the step (e). Accordingly, the distribution of the impurity ions implanted into the second active region in the following step (g) can be controlled with good reproducibility.

In the first method of fabricating a semiconductor device, when the step (c) corresponds to impurity ion implantation for controlling a threshold value of a MISFET, the variation in the threshold value of the MISFET can be suppressed.

The second method of fabricating a semiconductor device of this invention comprises the steps of (a) forming a semiconductor film on a semiconductor substrate; (b) forming, on the semiconductor film, a first photoresist film covering a first part of the semiconductor film and having an opening on a second part of the semiconductor film adjacent to the first part, and implanting impurity ions of a first conductivity type into the semiconductor film through the first photoresist film; (c) after removing the first photoresist film, forming a second photoresist film covering the second part of the semiconductor film and having an opening on the first part, and implanting impurity ions of a second conductivity type into the semiconductor film through the second photoresist film; (d) removing the second photoresist film; and (e) forming an insulating film on the semiconductor film through a reaction between at least oxygen and a semiconductor by subjecting, in an atmosphere including oxygen, the semiconductor substrate to plasma biased toward the semiconductor substrate.

In this method, although a step is formed on the top face of the semiconductor film in the ashing and the cleaning for removing the photoresist film in the step (d) owing to the difference in the conductivity type of the impurities implanted in the semiconductor film, a portion in the vicinity of the top face of the semiconductor film is oxidized in the process conducted at a low temperature in the step (e), so as to round the abrupt step. Accordingly, the harmful effect of the abrupt step on members formed on the semiconductor film afterward can be avoided without harmfully affecting the impurity distribution in the semiconductor film.

The second method of fabricating a semiconductor device can further comprise, before the step (a), a step of forming gate insulating films respectively on a first conductivity type MISFET formation region and a second conductivity type MISFET formation region of the semiconductor substrate, and the semiconductor film can be formed on the gate insulating films over the first and second conductivity type MISFET formation regions in the step (a), the first part may correspond to the second conductivity type MISFET formation region and the second part corresponds to the first conductivity type MISFET formation region in the steps (b) and (c), and the method can further include, after the step (d), a step of patterning the semiconductor film into a gate electrode of a dual gate type over the first conductivity type MISFET formation region and the second conductivity type MISFET formation region. In this case, an electric field can be well transferred between the gate electrodes of a CMIS inverter.

The second method of fabricating a semiconductor device can further comprise, after at least the step (d), a step of siliciding an upper portion of the semiconductor film after removing at least part of a thickness of the insulating film formed in the step (e) In this manner, an electric field can be well transferred between gate electrodes with low resistance.

The third method of fabricating a semiconductor device of this invention comprises the steps of (a) forming an insulating film on a semiconductor substrate; (b) forming a semiconductor film on the insulating film; (c) forming a gate electrode of a MISFET by patterning the semiconductor film by etching with a photoresist film used as a mask; and (d) oxidizing etching residues of the semiconductor film remaining on the exposed insulating film by subjecting, in an atmosphere including oxygen, the semiconductor substrate to plasma biased toward the semiconductor substrate, with keeping said photoresist film.

In this method, etching residues functioning as a conductor can be prevented from remaining around a member formed by patterning the semiconductor film, and the semiconductor substrate can be prevented from being roughened on its surface through ununiform etching in removing the insulating film afterward.

The third method of fabricating a semiconductor device can further comprise, after the step (d), steps of removing the oxidized etching residues and an exposed portion of the insulating film; and siliciding part of the semiconductor substrate exposed by removing the exposed portion of the insulating film. In this manner, a silicide layer with low resistance can be formed as part of a source/drain region of a MISFET.

When the step (d) is carried out at a temperature of 200° C. or less, the step (d) can be carried out with the photoresist film kept. Thereafter, oxidized etching residues and an insulating film can be removed by etching using the photoresist film.

The fourth method of fabricating a semiconductor device of this invention comprises the steps of (a) successively depositing a first insulating film and a conducting film at least including a metal on a semiconductor substrate; (b) patterning the conducting film and the first insulating film by etching with a photoresist film used as a mask into a gate electrode and a gate insulating film; (c) forming a second insulating film on at least an exposed portion of the semiconductor substrate through a reaction between oxygen and a semiconductor by subjecting, in an atmosphere including oxygen, the semiconductor substrate to plasma biased toward the semiconductor substrate, with the photoresist film kept; (d) removing the photoresist film; and (e) forming source/drain regions by introducing an impurity into regions positioned on both sides of the gate electrode in the semiconductor substrate.

In this method, even if the metal of the conducting film included in the gate electrode is dissolved in the cleaning solution, the metal ions can be prevented from entering the semiconductor substrate because the second insulating film is present on the semiconductor substrate. In addition, since there is no need to conduct a high temperature treatment like the thermal oxidation, the metal of the conducting film can be avoided from being oxidized.

In the fourth method of fabricating a semiconductor device, a polysilicon film and a metal film stacked thereon can be formed as the conducting film in the step (a), a bottom electrode of a polysilicon film and a top electrode of a metal film can be formed as the gate electrode in the step (b), and the second insulating film can be formed also on side faces of the bottom electrode in the step (c). In this manner, a semiconductor device including a gate electrode having the polymetal structure or the polycide structure can be fabricated.

In the fourth method of fabricating a semiconductor device, a silicon nitride film can be further formed on the conducting film in the step (a), an over-gate protection film of a nitride film can be formed on the top electrode in the step (b), and the method can further include, after the step (d), steps of (f) forming nitride film sidewalls on side faces of the polysilicon film and the metal film; (g) depositing an interlayer insulating film of a silicon oxide film on the substrate; and (h) forming a contact hole penetrating through the interlayer insulating film and reaching the source/drain region in a self-alignment manner against the gate electrode. In this manner, a semiconductor device, suitable to refinement, having the polymetal structure or the polycide structure and the so-called SAC (self-aligned contact) structure can be fabricated.

In the fourth method of fabricating a semiconductor device, the step (c) is preferably carried out at a temperature of 200° C. or less.

The fifth method of fabricating a semiconductor device of this invention comprises the steps of (a) forming a first gate electrode from a semiconductor film including an impurity of a first conductivity type on a first conductivity type MISFET formation region of a semiconductor substrate with a first gate insulating film sandwiched therebetween, and forming a second gate electrode from a semiconductor film including an impurity of a second conductivity type on a second conductivity type MISFET formation region of the semiconductor substrate with a second gate insulating film sandwiched therebetween; (b) forming a coat insulating film through a reaction between at least oxygen and a semiconductor on the semiconductor substrate and exposed portions of the first and second gate electrodes by subjecting, in an atmosphere including oxygen, the semiconductor substrate to plasma biased toward the semiconductor substrate; (c) forming source/drain regions of a first conductivity type MISFET through ion implantation of an impurity of the first conductivity type by using, as masks, a first photoresist film covering the second conductivity type MISFET formation region and having an opening on the first conductivity type MISFET formation region and the first gate electrode; (d) removing the first photoresist film; and (e) forming source/drain regions of a second conductivity type MISFET through ion implantation of an impurity of the second conductivity type by using, as masks, a second photoresist film covering the first conductivity type MISFET formation region and having an opening on the second conductivity type MISFET formation region and the second gate-electrode.

In this method, since the coat insulating film can be formed at a low temperature in the step (b), punch-through of boron included in the gate electrode into the semiconductor substrate caused in the thermal oxidation can be avoided. Furthermore, since the surface of the semiconductor substrate can be protected by the coat insulating film, the surfaces of the source/drain regions can be prevented from being etched in removing the photoresist film in the following step (d) even when the gate insulating film has a small thickness, and hence, the sheet resistance of the source/drain regions can be kept small.

In the fifth method of fabricating a semiconductor device, the step (b) is preferably carried out at a temperature of 300° C. or less.

Furthermore, the first photoresist film is preferably removed in the step (d) by ashing with a degree of biasing plasma smaller than a degree of biasing the plasma in the step (b). In this manner, the ashing can be carried out without increasing the thickness of the coat insulating film formed on the semiconductor substrate. As a result, the impurity profile in the surface portion of the semiconductor substrate is minimally changed, and hence, the leak characteristic and the like of the semiconductor device can be kept satisfactorily.

The sixth method of fabricating a semiconductor device of this invention comprises the steps of (a) successively depositing a pad oxide film and a masking nitride film on a semiconductor substrate; (b) forming an opening in the masking nitride film and the pad oxide film in a position corresponding to a trench formation region; (c) forming a trench in the semiconductor substrate by conducting etching with the masking nitride film used as a mask; (d) forming a rounding insulating film through a reaction between at least oxygen and a semiconductor on a portion of the semiconductor substrate exposed within the trench by subjecting, in an atmosphere including oxygen, the semiconductor substrate to plasma biased toward the semiconductor substrate; and (e) forming a trench isolation region by filling the trench with an insulating film.

In this method, an abrupt edge of the semiconductor substrate exposed because the pad oxide film sinks in forming a trench by the etching in the step (b) can be rounded by forming the rounding insulating film in the step (d). Therefore, it is possible to suppress the degradation of the reliability of the gate insulating film derived from electric field collection in a MISFET formed therein and the occurrence of the hump characteristic in the MISFET.

The sixth method of fabricating a semiconductor device can further comprises, after the step (d) and before the step (e), a step of increasing a thickness of the rounding insulating film by thermal oxidation. In this manner, an underlying oxide film for a trench isolation region can be formed without causing the problem of the electric field collection and the like.

BRIEF DESCRIPTION OF THE DRAWINGS

FIGS. 2(a) and 2(b) show data of dependency, on processing time and bias, of the thickness of a silicon oxide film formed by bias plasma oxidation;

FIGS. 8(a), 8(b), 8(c), 8(d) and 8(e) are TEM images of oxide films formed through the bias plasma oxidation on a channel region of an NMOSFET, a channel region of a PMOSFET, a substantially intrinsic substrate, an N-type polysilicon film and a P-type polysilicon film, respectively;

FIG. 13 is a diagram for showing difference in an electric resistance value of a polycide layer resulting from the bias plasma oxidation;

FIGS. 19(a) and 19(b) show data for comparison in the Ion-Ioff characteristic between MOSFETs formed in Embodiment 3 and MOSFETs formed without the plasma oxidation;

DETAILED DESCRIPTION OF THE INVENTION

Formation of Oxide Film by Bias Plasma Oxidation

Before describing preferred embodiments of the invention, a system employed for bias plasma oxidation of this invention and the characteristic of an oxide film formed by the bias plasma oxidation will be described.

Figure 1:
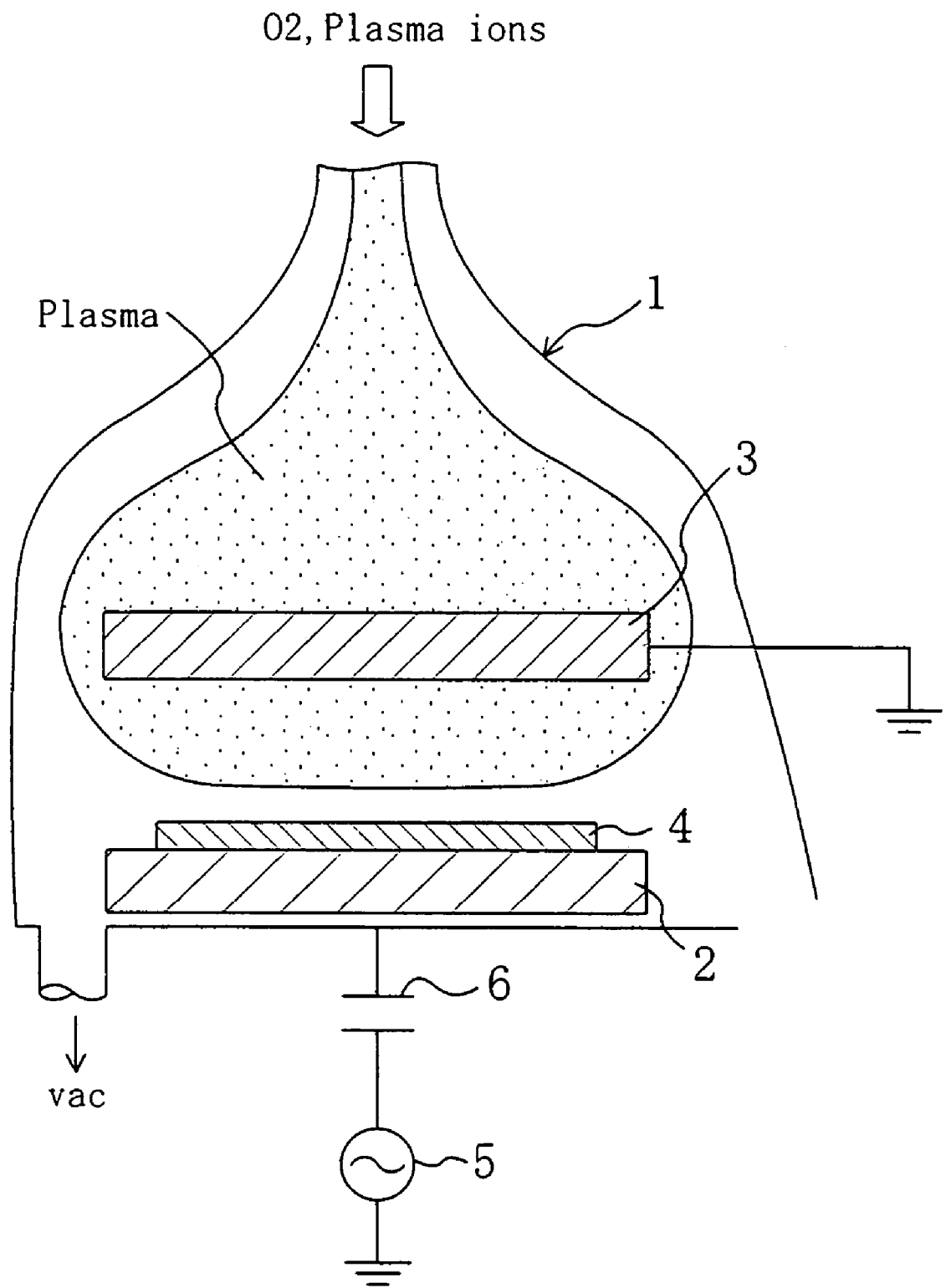
FIG. 1 is a cross-sectional view for schematically showing the structure of a bias plasma generation system used in each embodiment of the invention.

FIG. 1 is a sectional view for schematically showing the structure of the bias plasma generation system employed in each of the preferred embodiments. The bias plasma generation system includes a lower electrode 2 serving as an anode and disposed on the bottom of a chamber 1, a bias electrode 3 serving as a cathode and opposing the lower electrode 2, and a high frequency power supply 5 for applying high frequency power (of 13.56 MHz) to the lower electrode through a capacitor 6. A processing wafer 4 is placed on the lower electrode 2, plasma and a reaction gas (oxygen) are introduced through an upper portion of the chamber 1, and the reaction gas is vacuated through an exhaust port provided to the chamber 1 in the vicinity of the lower electrode 2. As the plasma generation system, any of various plasma generation systems, such as a capacity coupling plasma system, an induction coupling plasma system, an ECR plasma generation system and a helicon plasma generation system, can be employed by additionally providing a bias electrode.

In conducting processing by using bias plasma, for example, the temperature of the lower electrode 2 is set to 180° C., an oxygen gas is introduced through the upper portion of the chamber at a flow rate of approximately 800 sccm, the gas pressure is set to 0.5 Torr (66.65 Pa) and high frequency power of 1000 W is applied by the high frequency power supply 5. Thus, a Si layer (monosilicon, polysilicon or amorphous silicon) exposed on the wafer 4 is oxidized into a silicon oxide film. The high frequency power can be replaced with a DC voltage. The experiment results described below are obtained by applying not the high frequency power but the DC voltage.

FIGS. 2(a) and 2(b) show data of dependency, on processing time and bias, of the thickness of a silicon oxide film formed by conducting the bias plasma oxidation on a processing wafer. In FIG. 2(a), the abscissa indicates time (sec.) for applying the bias plasma, and the ordinate indicates the thickness (nm) of the formed silicon oxide film ($SiO_2$ film). As is shown in FIG. 2(a), the bias plasma oxidation is found to have a characteristic form of oxidation as follows: As the bias plasma oxidation is proceeded, the thickness of the oxide film is abruptly increased to 3 nm at the initial stage, but thereafter, even though the bias plasma oxidation is further proceeded, the increasing rate of the thickness of the silicon oxide film is lowered. When the bias plasma oxidation is carried out for 10 min., the thickness of the oxide film is substantially saturated at approximately 6 nm.

Figure 3:
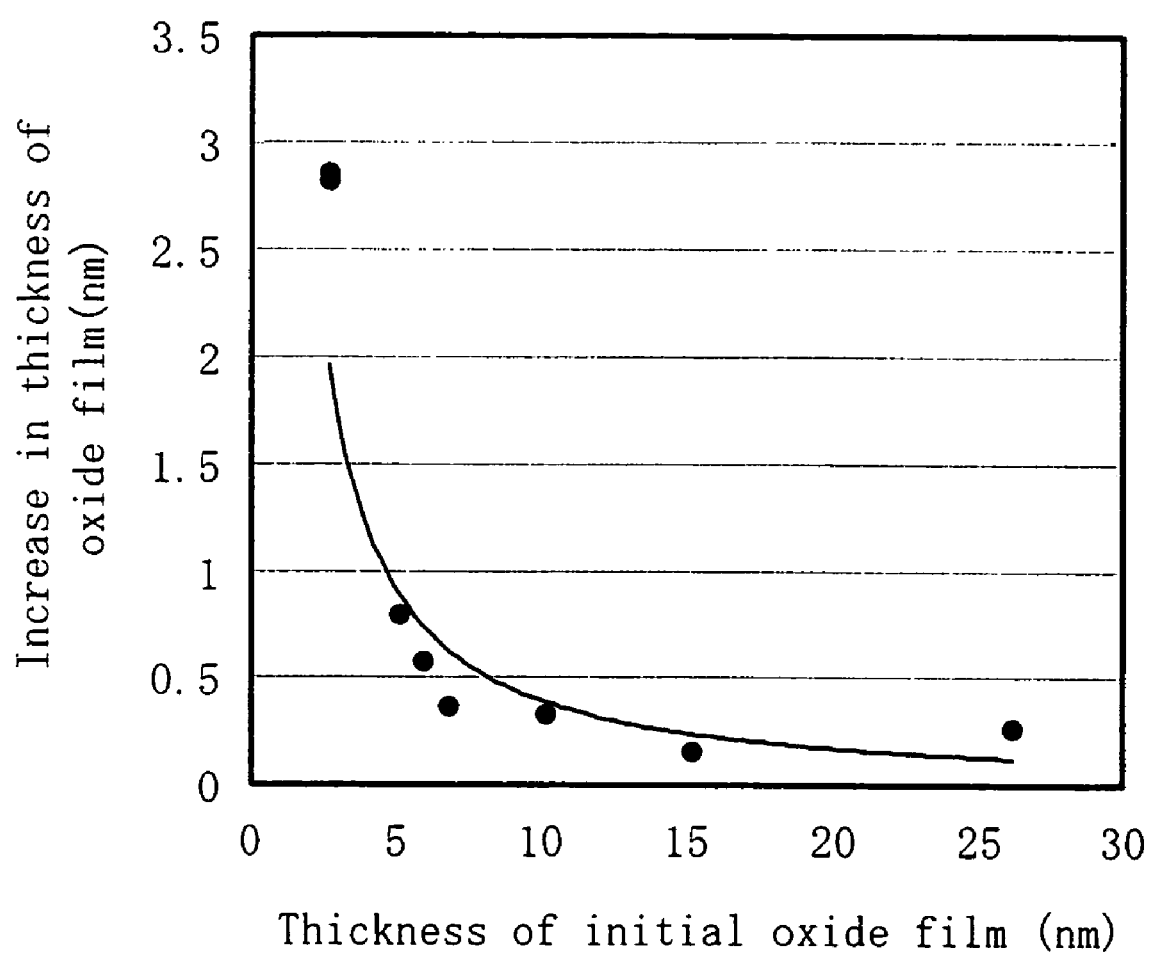
FIG. 3 is a diagram for showing dependency, on the thickness of an initial oxide film, of increase in the thickness of an oxide film formed by the bias plasma oxidation conducted on a wafer where the initial oxide film is previously formed.

FIG. 3 shows the dependency, on the thickness of an initial oxide film, of the increase in the thickness of an oxide film formed through the bias plasma oxidation conducted on a wafer where the initial oxide film is previously formed. In FIG. 3, the abscissa indicates the thickness of the initial oxide film formed on the wafer by thermal oxidation before conducting the bias plasma oxidation, and the ordinate indicates the increase (nm) in the thickness of the oxide film obtained by conducting the bias plasma oxidation for 5 min. under the aforementioned conditions (with the temperature of the lower electrode set to 180° C.), namely, the thickness of a newly formed oxide film. As is shown in FIG. 3, in the case where the initial oxide film has a thickness of 6 nm or less, the newly oxide film is formed through the bias plasma oxidation conducted for 10 min., so that the total thickness of the oxide films can be approximately 6 nm. In other words, the total thickness of the oxide films is naturally controlled to be a constant value (of approximately 6 nm). On the other hand, when the initial oxide film has a thickness exceeding 6 nm, the total thickness of the oxide films is minimally increased through the bias plasma oxidation.

In FIG. 2(b), the abscissa indicates RF power (W) corresponding to the degree of biasing the plasma, and the ordinate indicates the thickness (nm) of the formed silicon oxide film. As is shown in FIG. 2(b), the thickness of the oxide film is substantially linearly increased in accordance with the RF power (bias). Specifically, the saturation thickness of the oxide film is largely affected by the bias, and it is confirmed that as the bias increases, the saturation thickness of the oxide film increases and that as the bias decreases, the saturation thickness of the oxide film decreases. In other words, the total thickness of the oxide films can be controlled in accordance with the bias.

As a characteristic of the bias plasma oxidation, an oxide film can be sufficiently formed at a low temperature of 200° C. or less (including room temperature). In conducting the bias plasma oxidation at such a low temperature, even when a photoresist film is formed on the wafer, the rate of removing the photoresist film is so low that it is minimally removed. This is because ashing for removing a photoresist film is generally conducted at approximately 250° C. or more. Accordingly, when a photoresist film is present on the wafer, the bias plasma oxidation is preferably conducted at 200° C. or less, whereas when no photoresist film is present, the temperature can be increased to approximately 300° C.

Conventional plasma oxidation is carried out at 350 through 600° C., and therefore, when a photoresist film is present on a wafer, the photoresist film is unavoidably damaged in forming an oxide film.

The frequency of the high frequency power may be varied in a range between 200 KHz and 20 MHz or the high frequency power may be a DC voltage as described above, whereas the plasma can be biased probably more effectively by using the high frequency power. In particular, radicals or ions included in the plasma can be more easily biased by using high frequency power with a comparative low frequency of 800 KHz or 400 KHz.

The reaction gas is not limited to oxygen but can be a mixture of nitrogen and oxygen. For example, the bias plasma oxidation can be conducted in a NO gas atmosphere or an atmosphere including oxygen and nitrogen. It goes without saying that it can be conducted in an atmosphere including oxygen but substantially no nitrogen.

Now, a method of forming a bias plasma oxide film and a method of fabricating a semiconductor device using the method will be described.

EMBODIMENT 1

FIGS. 4(a) through 4(d), 5(a) through 5(d), 6(a) through 6(d) and 7(a) through 7(d) are sectional views for showing procedures in fabrication of a CMOS device having a trench isolation structure and a dual gate structure according to Embodiment 1.

Figure 4A:
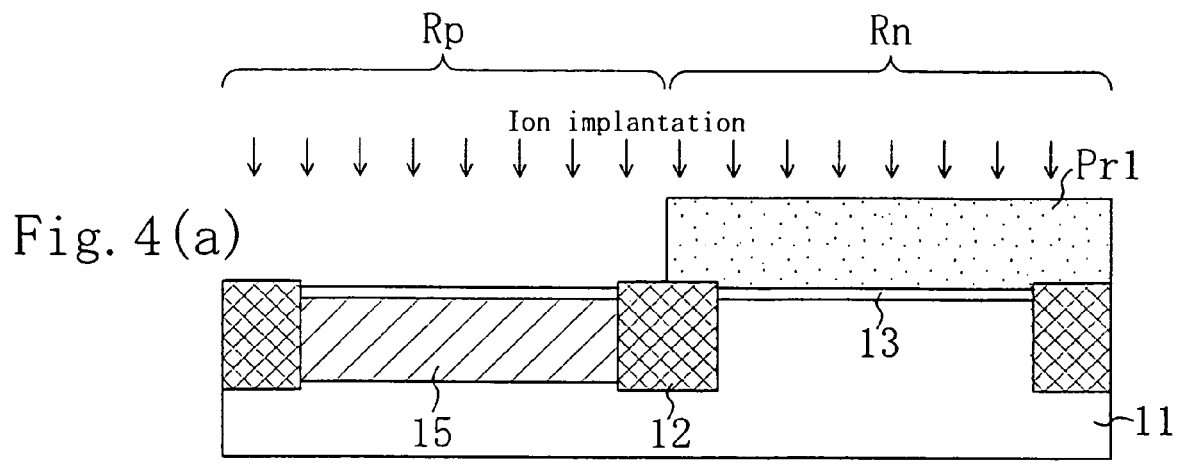
FIGS. 4(a), 4(b), 4(c) and 4(d) are cross-sectional views for showing procedures in fabrication of a CMOS device having a trench isolation structure and a dual gate structure according to Embodiment 1 up to ion implantation for forming wells.

First, in the procedure shown in FIG. 4(a), after forming a trench isolation region 12 in a Si substrate 11, a protection oxide film 13 with a thickness of approximately 10 nm is formed in an active region of the Si substrate 11 by thermal oxidation. Then, a photoresist film Pr1 covering an NMOSFET formation region Rn and having an opening on a PMOSFET formation region Rp is formed on the substrate by photolithography. Thereafter, phosphorus ions (P$^+$) are implanted into a portion of the Si substrate 11 within the opening of the photoresist film Pr1 (namely, the PMOSFET formation region Rp) at implantation energy of 140 keV and a dose of $1\times10^{12}$ cm$^{-2}$, thereby forming an N-type well region 15. Also, boron ions (B$^+$) for controlling a threshold voltage are implanted at implantation energy of 20 keV and a dose of $6\times10^{12}$ cm$^{-2}$, and arsenic ions (As$^+$) for stopping punch-through are implanted at implantation energy of 300 keV and a dose of $4\times10^{12}$ cm$^{-2}$. In this manner, the so-called buried channel region is formed. Alternatively, when a surface PMOSFET is desired, the ion implantation for controlling the threshold voltage is carried out by implanting phosphorus ions (P$^+$) at implantation energy of 50 keV and a dose of $5\times10^{12}$ cm$^{-2}$.

Figure 4B:
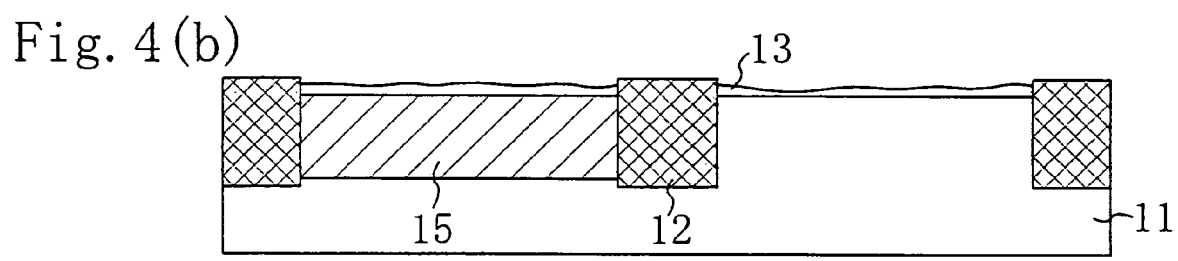

Next, in the procedure shown in FIG. 4(b), the photoresist film Pr1 is removed by ashing and RCA cleaning. Specifically, the photoresist film is removed and the substrate is cleaned by ashing utilizing plasma in an oxygen atmosphere and by cleaning utilizing a mixed solution of sulfuric acid and hydrogen peroxide or hydrofluoric acid. At this point, the protection oxide film 13 is etched mainly by the RCA cleaning, and hence its thickness is reduced as a whole and becomes ununiform. Therefore, in the procedure shown in FIG. 4(c), the bias plasma oxidation is carried out for 5 minutes by using the plasma generation system of FIG. 1 in an atmosphere including oxygen at a substrate temperature of 180° C. and bias power of 1000 W. Through this bias plasma oxidation, the protection oxide film 13 is recovered into a protection oxide film 13a with a substantially uniform thickness of approximately 10 nm. Specifically, as is understood from FIGS. 2(a), 2(b) and 3, since an oxide film formed through the bias plasma oxidation has a thickness corresponding to a constant saturation value determined depending upon the bias power, the damaged protection oxide film can be thus recovered into the protection oxide film 13a with a substantially uniform thickness. This bias plasma oxidation can be carried out at a high temperature of approximately 300° C.

Figure 4C:
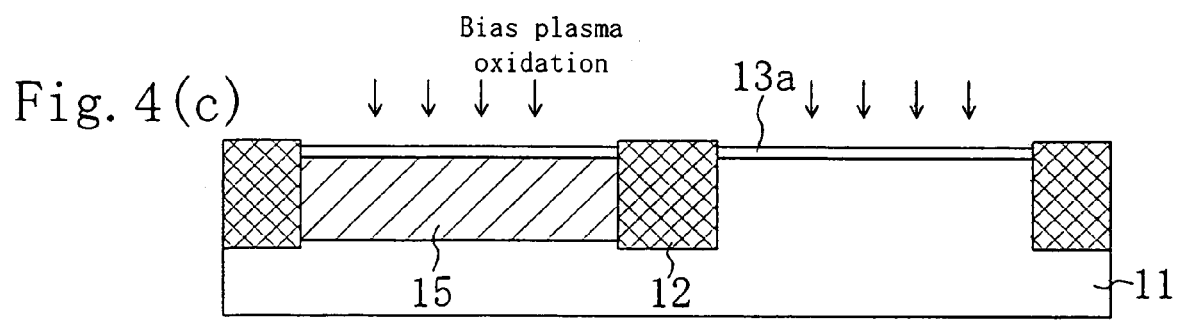
Figure 4D:
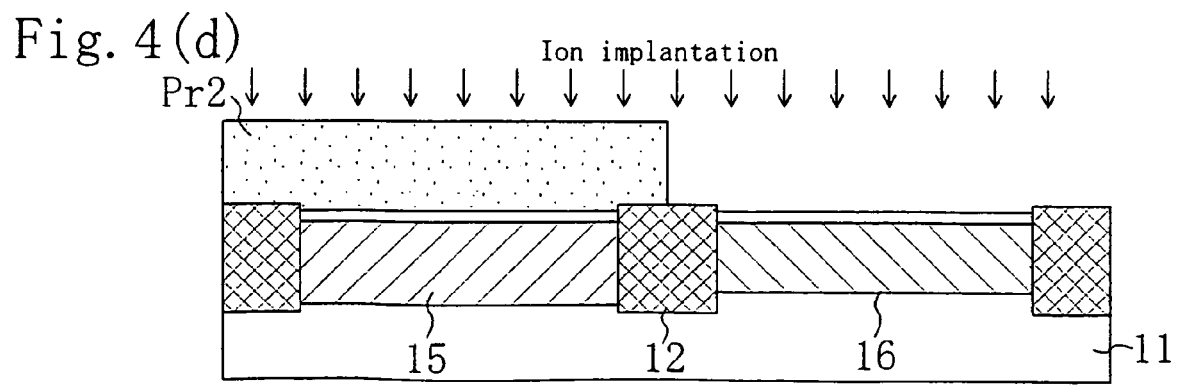

Next, in the procedure shown in FIG. 4(d), a photoresist film Pr2 covering the PMOSFET formation region Rp and having an opening on the NMOSFET formation region Rn is formed on the substrate by the photolithography. Thereafter, boron ions (B$^+$) are implanted into a portion of the Si substrate 11 within the opening of the photoresist film Pr2 (namely, the NMOSFET formation region Rn) at implantation energy of 280 keV and a dose of $1\times10^{13}$ cm$^{-2}$, thereby forming a P-type well region 16. Also, boron ions (B$^+$) for controlling a threshold value are implanted at implantation energy of 30 keV and a dose of $6\times10^{12}$ cm$^{-2}$. Thus, the so-called surface type channel region is formed.

Subsequently, in the procedure shown in FIG. 5(a), the photoresist film Pr2 is removed by the ashing and the RCA cleaning, and the protection oxide film 13a is also removed. Then, the bias plasma oxidation is carried out for 5 minutes in an atmosphere including oxygen (or oxygen and nitrogen) at a substrate temperature of 180° C. and bias power of 1000 W. Thus, gate insulating films 17a and 17b of an oxide film (or a nitrided oxide film) with a thickness of approximately 6 nm are formed in the active region of the Si substrate 11. At this point, the insulating film formed through the bias plasma oxidation has a thickness saturated at a substantially constant value regardless of the kinds of impurities included in the Si layers (well regions 15 and 16) below. Accordingly, the gate insulating films 17a and 17b with an equivalent thickness of approximately 6 nm can be formed.

Figure 5A:
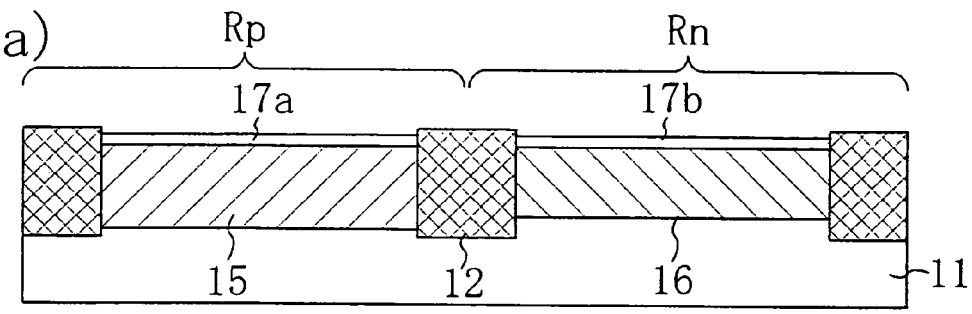
FIGS. 5(a), 5(b), 5(c) and 5(d) are cross-sectional views for showing other procedures in the fabrication of the CMOS device having the trench isolation structure and the dual gate structure of Embodiment 1 up to impurity ion implantation into a polysilicon film for gate electrodes.
Figure 5B:
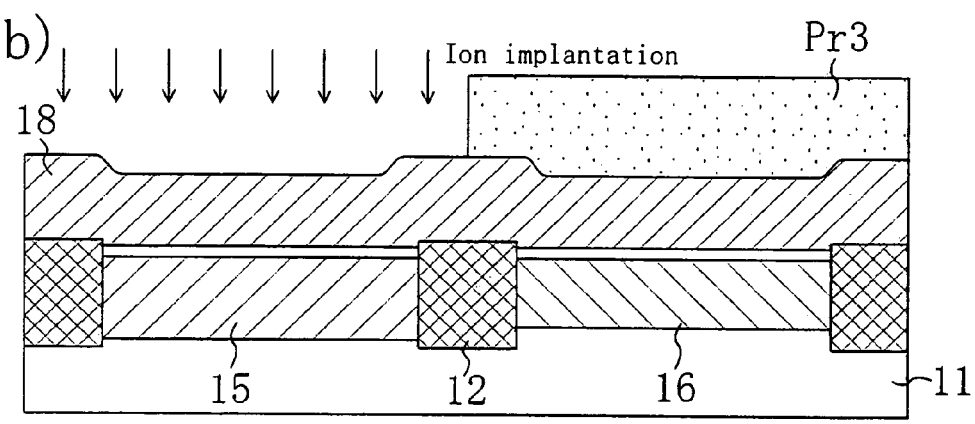

Next, in the procedure shown in FIG. 5(b), a polysilicon film 18 for gate electrodes with a thickness of approximately 200 nm is deposited on the substrate, and then, a photoresist film Pr3 covering the NMOSFET formation region Rn and having an opening on the PMOSFET formation region Rp is formed on the polysilicon film 18. Thereafter, boron ions (B$^+$) are implanted into a portion of the polysilicon film 18 within the opening of the photoresist film Pr3 (namely, the PMOSFET formation region Rp) at implantation energy of 5 keV and a dose of $3\times10^{15}$ cm$^{-2}$.

Figure 5C:
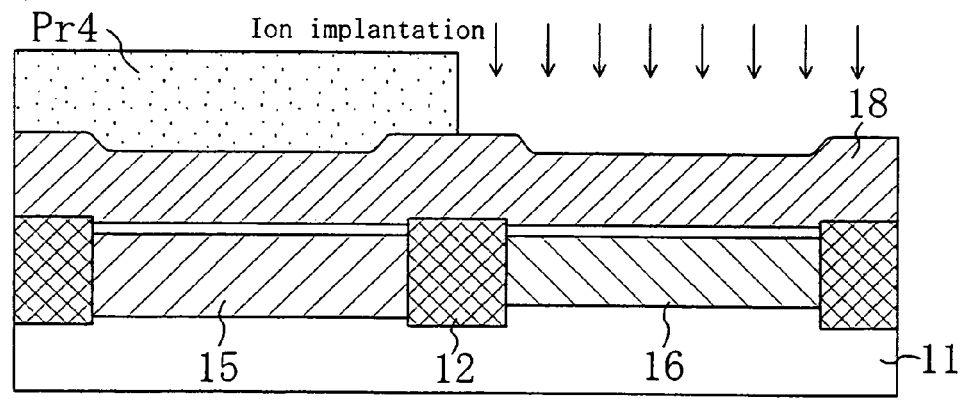

Similarly, in the procedure shown in FIG. 5(c), the photoresist film Pr3 is removed by the ashing and the RCA cleaning, and a photoresist film Pr4 covering the PMOSFET formation region Rp and having an opening on the NMOFET formation region Rn is formed on the polysilicon film 18 by the photolithography. Then, phosphorus ions (P⁺) are implanted into a portion of the polysilicon film 18 within the opening of the photoresist film Pr4 (namely, the NMOSFET formation region Rn) at implantation energy of 15 keV and a dose of $5 \times 10^{15}$ cm$^{-2}$.

Figure 5D:
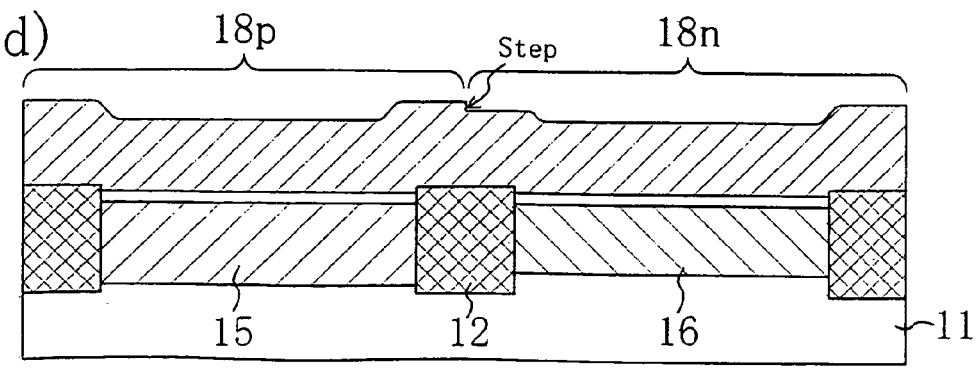

Then, in the procedure shown in FIG. 5(d), the photoresist film Pr4 is removed by the ashing and the RCA cleaning, and a heat treatment is carried out for activating the impurities implanted into the polysilicon film 18. In this manner, a P-type polysilicon film 18p is formed in the PMOSFET formation region Rp and an N-type polysilicon film 18n is formed in the NMOSFET formation region Rn. At this point, the P-type polysilicon film 18p and the N-type polysilicon film 18n are etched by the RCA cleaning and cleaning conducted before loading the substrate in a furnace, and due to a difference therebetween in the etch rate, an abrupt step is formed therebetween as described above.

Subsequently, in the procedure shown in FIG. 6(a), the bias plasma oxidation is carried out for 1 through 5 minutes in an atmosphere including oxygen at a substrate temperature of 180° C. and bias power of 1800 W. Thus, the entire surfaces of the polysilicon films 18p and 18n are oxidized into an oxide film 19 with a thickness of approximately 10 nm. This bias plasma oxidation can be carried out at approximately 300° C.

Figure 6A:
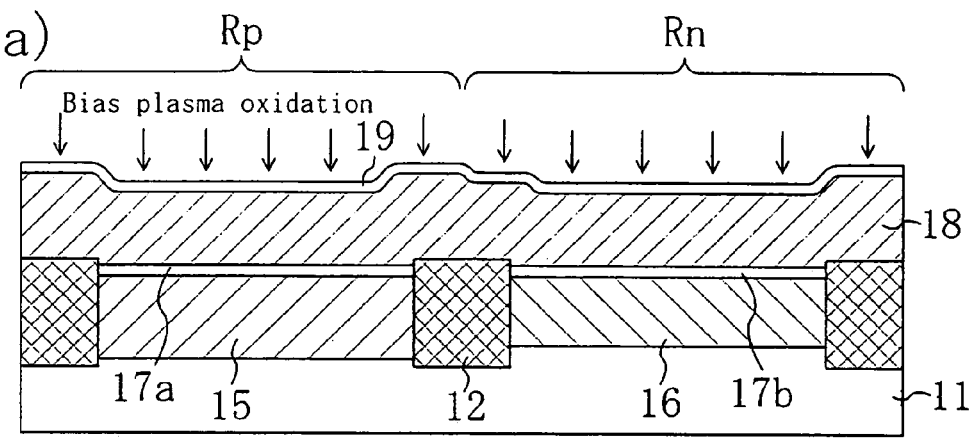
FIGS. 6(a), 6(b), 6(c) and 6(d) are cross-sectional views for showing other procedures in the fabrication of the CMOS device having the trench isolation structure and the dual gate structure of Embodiment 1 up to formation of the gate electrodes.
Figure 6B:
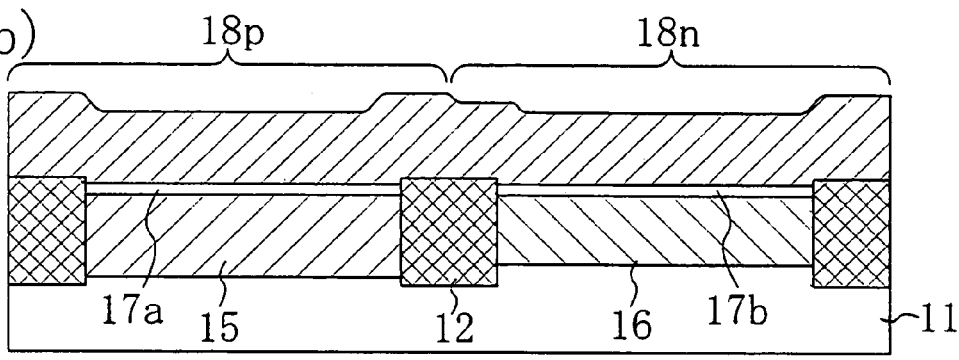

Next, in the procedure shown in FIG. 6(b), the oxide film 19 is removed by etching. As a result, the abrupt step having been present on the boundary between the P-type polysilicon film 18p and the N-type polysilicon film 18n is rounded and disappears.

Figure 6C:
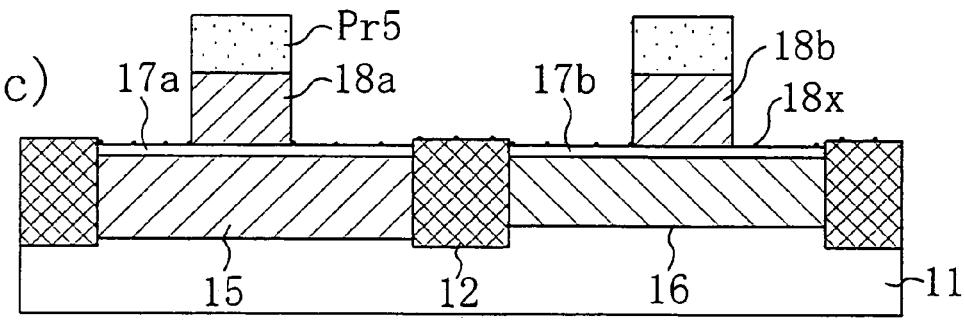

Then, in the procedure shown in FIG. 6(c), a photoresist film Pr5 covering a gate formation region is formed by the photolithography, and the P-type polysilicon film 18p and the N-type polysilicon film 18n are patterned through dry etching using the photoresist film Pr5 as a mask, thereby forming a gate electrode 18a of the PMOSFET and a gate electrode 18b of the NMOSFET. At this point, when it is determined that removal of the polysilicon films 18p and 18n is completed, the gate insulating films 17a and 17b are dotted with etching residues 18x of the polysilicon films 18p and 18n. Therefore, with the photoresist film Pr5 kept, the bias plasma oxidation is carried out for 5 minutes in an atmosphere including oxygen (or oxygen and nitrogen) at a substrate temperature of 180° C. and bias power of 1000 W, thereby changing the etching residues 18x into an oxide film (or a nitrided oxide film).

Figure 6D:
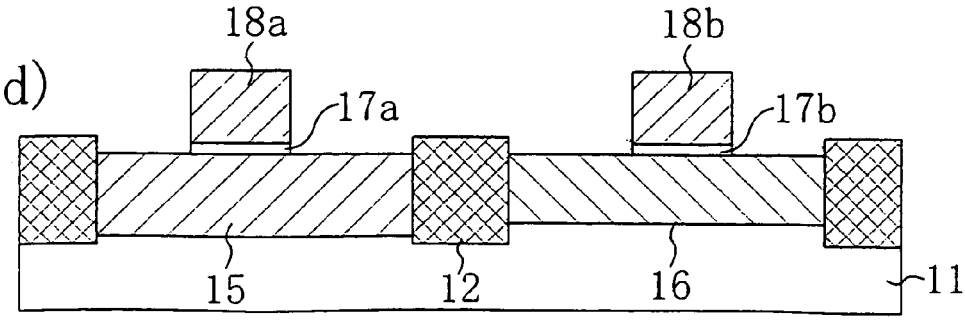

Next, in the procedure shown in FIG. 6(d), after removing the photoresist film Pr5, portions of the gate insulating films 17a and 17b not covered with the gate electrode 18a or 18b are removed through the dry etching. The etching residues 18x may be oxidized by the aforementioned bias plasma oxidation after removing the photoresist film Pr5.

Figure 7A:
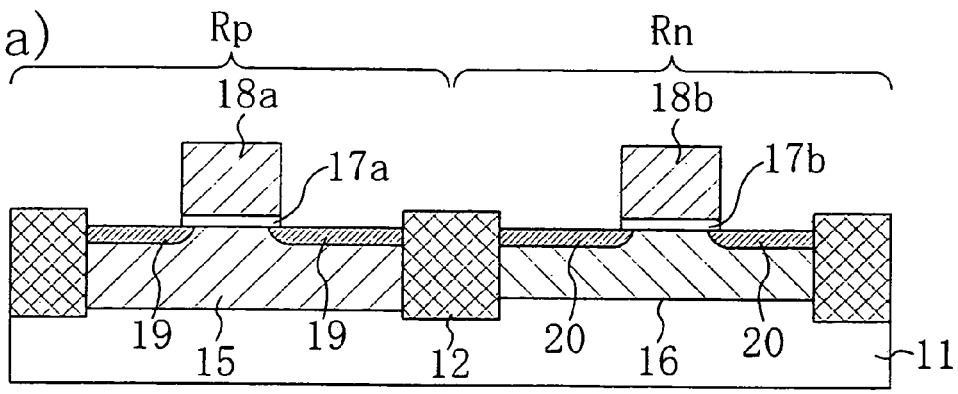
FIGS. 7(a), 7(b), 7(c) and 7(d) are cross-sectional views for showing other procedures in the fabrication of the CMOS device having the trench isolation structure and the dual gate structure of Embodiment 1 up to formation of a salicide film.

Subsequently, in the procedure shown in FIG. 7(a), although not shown in the drawing, a photoresist film covering the NMOSFET formation region Rn and having an opening on the PMOSFET formation region Rp is formed, and P-type impurity(ions are implanted by using the photoresist film and the gate electrode 18a of the PMOSFET as masks, thereby forming low concentration source/drain regions 19 of the PMOSFET. Then, a photoresist film covering the PMOSFET formation region Rp and having an opening on the NMOSFET formation region Rn is formed, and N-type impurity ions are implanted by using the photoresist film and the gate electrode 18b of the NMOSFET as masks, thereby forming low concentration source/drain regions 20 of the NMOSFET. At this point, it is preferred that the bias plasma oxidation is carried out for forming a thin oxide film before forming the photoresist film and that the photoresist film is removed after the ion implantation.

Figure 7B:
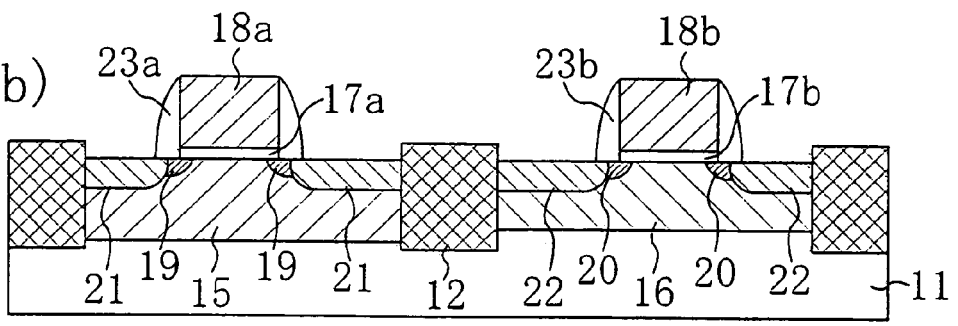

Next, in the procedure shown in FIG. 7(b), a silicon oxide film is deposited on the substrate and is then etched back, thereby forming sidewalls 23a and 23b on the side faces of the gate electrodes 18a and 18b of the MOSFETS. Thereafter, although not shown in the drawing, a photoresist film covering the NMOSFET formation region Rn and having an opening on the PMOSFET formation region Rp is formed, and P-type impurity ions are implanted by using the photoresist film and the gate electrode 18a and the oxide film sidewalls 23a of the PMOSFET as masks, thereby forming high concentration source/drain regions 21 of the PMOSFET. Then, a photoresist film covering the PMOSFET formation region Rp and having an opening on the NMOSFET formation region Rn is formed, and N-type impurity ions are implanted by using the photoresist film and the gate electrode 18b and the oxide film sidewalls 23b of the NMOSFET as masks, thereby forming high concentration source/drain regions 22 of the NMOSFET. At this point, it is preferred that a thin oxide film is formed by the bias plasma oxidation before forming the photoresist film. When a thin oxide film is thus formed, before the ion implantation, by the plasma oxidation of the gate electrode, the implanted ions can be prevented from punching through the gate electrode.

Figure 7C:
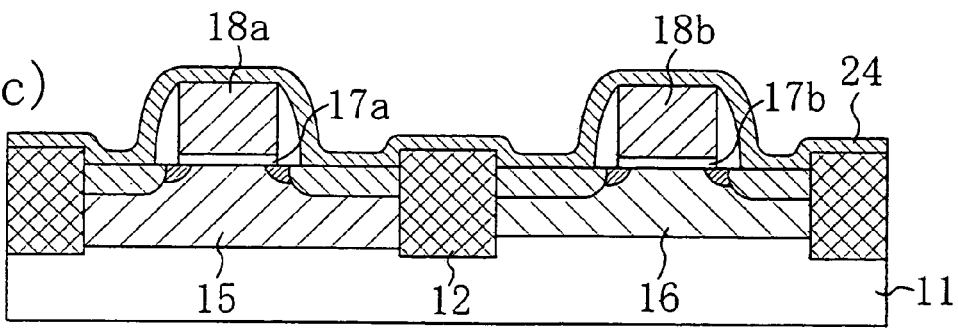

Then, in the procedure shown in FIG. 7(c), a Co film 24 with a thickness of approximately 8 nm is deposited on the substrate, and a heat treatment is conducted at 500° C. for 60 seconds. Thus the Co film is allowed to react with the Si substrate 11 and the gate electrodes 18a and 18b in portions where they are in contact with each other, thereby forming a CoSi film (monosilicide film). At this point, the oxide film with a thickness of approximately 1 nm resulting from the bias plasma oxidation may remain on the surfaces of the gate electrodes 18a and 18b and the Si substrate 11. The remaining oxide film can prevent cobalt from abnormally diffusing along the interface of the polysilicon, resulting in forming homogenous $CoSi_2$.

Figure 7D:
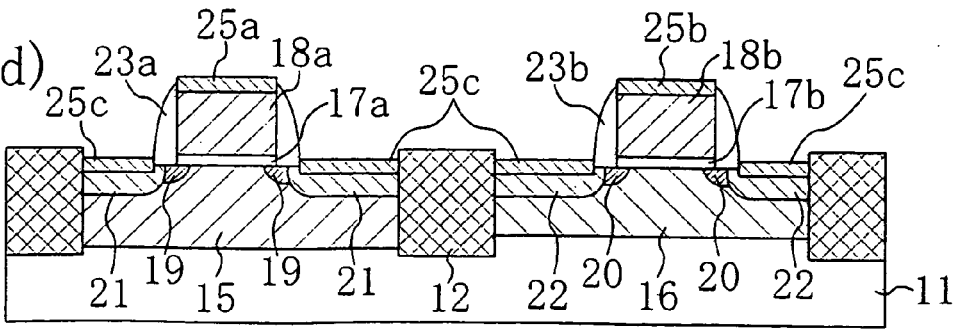

Next, in the procedure shown in FIG. 7(d), an unreacted portion of the Co film 24 is removed, and a heat treatment is carried out at 800° C. for 10 seconds for changing the crystal structure to $CoSi_2$. Thus, silicide layers 25a through 25c with low resistance are formed on the gate electrodes 18a and 18b and the high concentration source/drain regions 21 and 22.

In this embodiment, oxide films (or nitrided oxide films) are formed through the bias plasma oxidation at various points in the fabrication procedures for the semiconductor device. As a result, the following effects can be attained:

First, since the gate insulating films 17a and 17b of oxide films (or nitrided oxide films) are formed by the bias plasma oxidation in the procedure shown in FIG. 5(a), the gate insulating film 17a of the PMOSFET and the gate insulating film 17b of the NMOSFET have substantially the same thickness. This is because an oxide film (or a nitrided oxide film) formed by the bias plasma oxidation has a thickness minimally affected by the conductivity type of an impurity introduced into the underlying Si layer.

FIGS. 8(a) through 8(e) are TEM images of oxide films formed through the bias plasma oxidation on a channel region of an NMOSFET (where boron ions are implanted), a channel region of a PMOSFET (where arsenic ions ate implanted), a substantially intrinsic substrate (where no ions are implanted), an N-type polysilicon film (where phosphorus ions are implanted) and a P-type polysilicon film (where boron ions are implanted), respectively. As is understood through observation of FIGS. 8(a) through 8(c), there is substantially no significant difference in the thickness among the gate oxide films no matter what kind of ions are implanted and no matter whether ion implantation is conducted. A difference in the thickness of approximately 0.6 nm can be regarded within a range of measurement error.

In addition, the bias plasma oxidation, which is carried out at a low temperature of 180°C., does not change the impurity concentration profile in the P-type well region 16 for controlling the threshold voltage of the NMOSFET and the impurity concentration profile in the N-type well region 15 for controlling the threshold voltage of the PMOFET. Accordingly, the conventional problems, namely, the acceleration of the short channel effect of the MOSFET, the increase of variation in the threshold voltages of the NMOSFET and the PMOSFET and the increase of an off leakage current, can be avoided. Also, an oxide film formed by the bias plasma oxidation has reliability substantially equivalent to that of a thermal oxide film.

Figure 9:
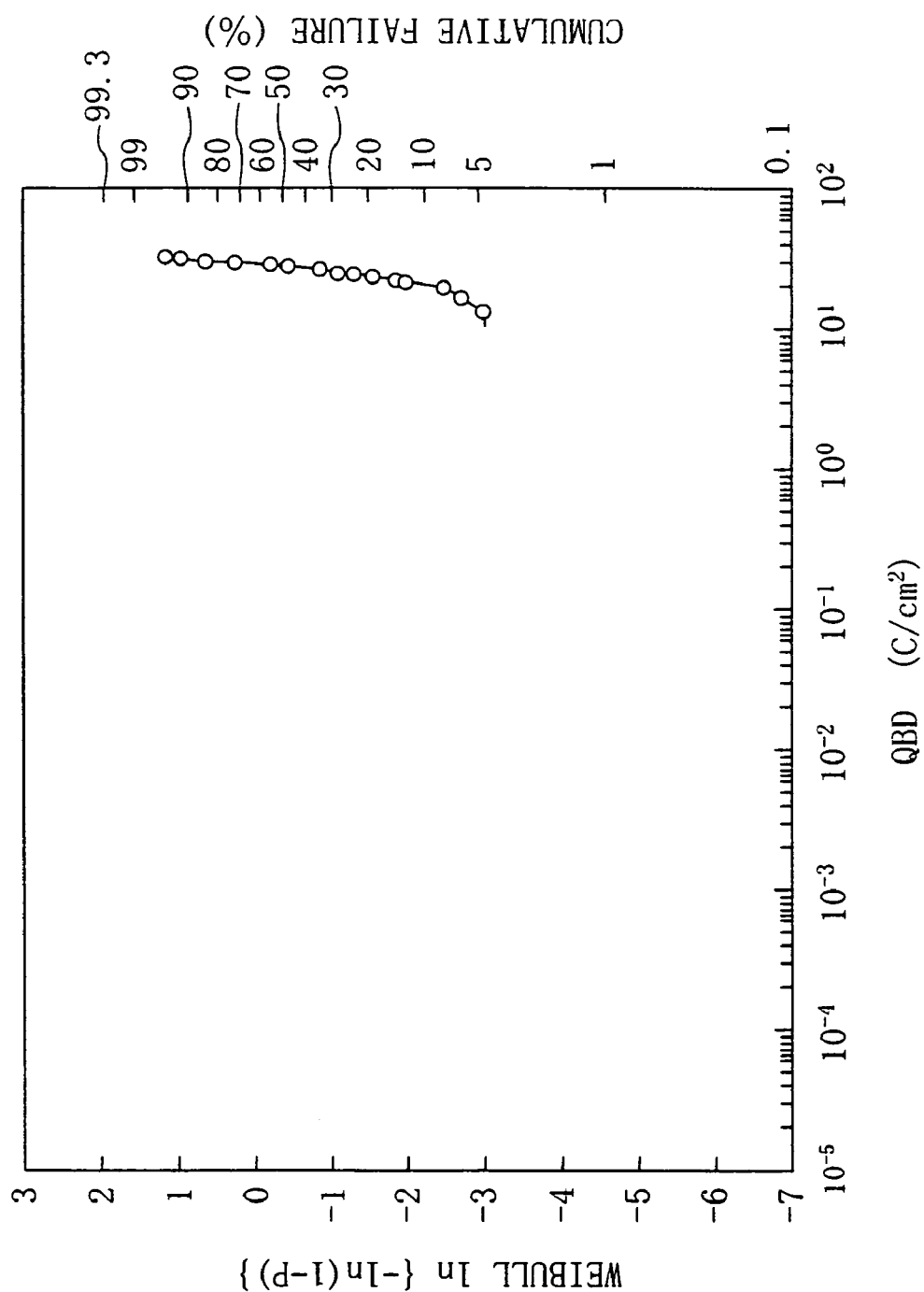
FIG. 9 is a diagram for showing the result of QBD evaluation of a PMOSFET including a gate insulating film formed through the bias plasma oxidation in Embodiment 1.
Figure 10:
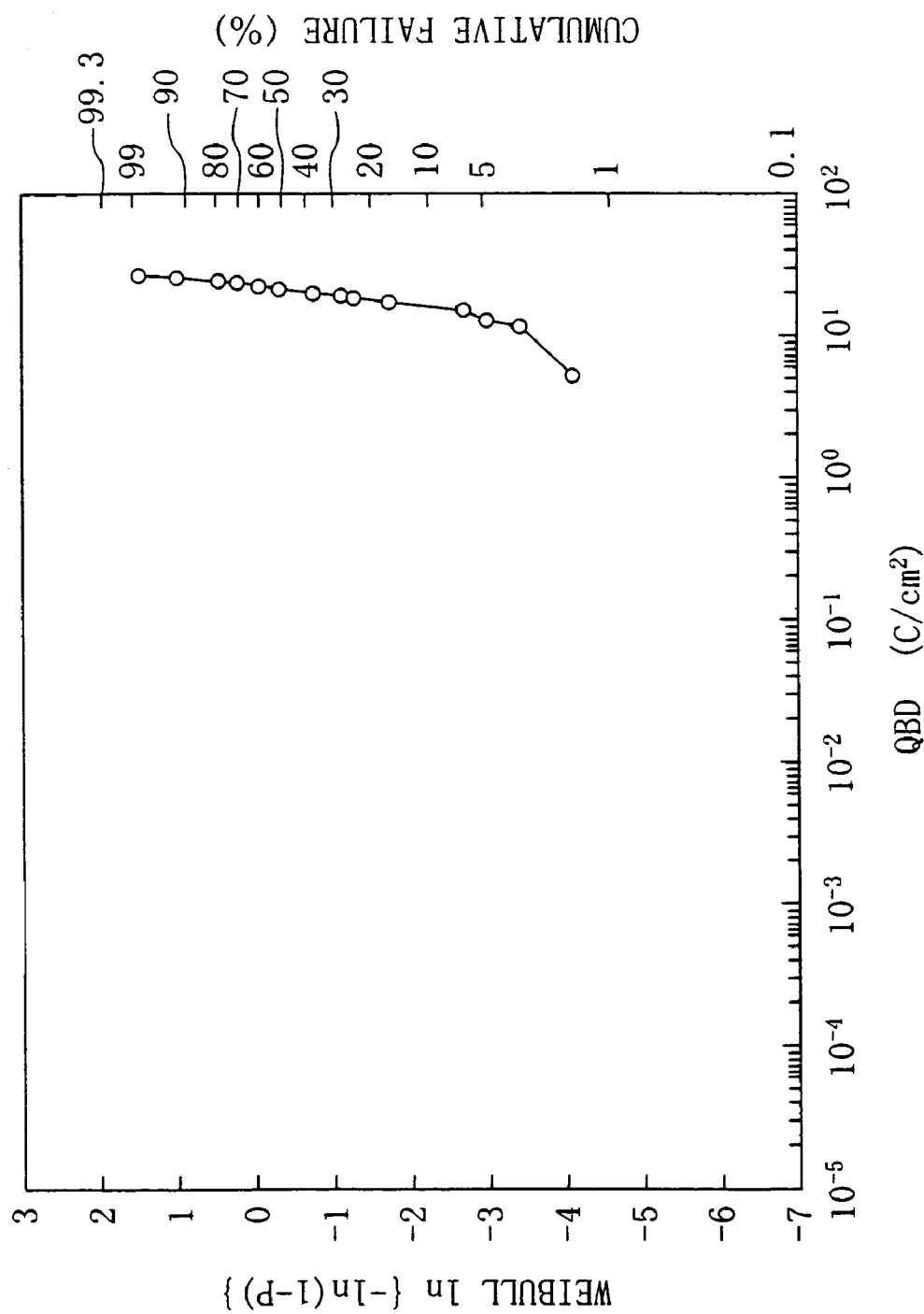
FIG. 10 is a diagram for showing the result of the QBD evaluation of a conventional PMOSFET including a gate insulating film of a thermal oxide film (pyrogenic oxidized at 900° C.)

FIG. 9 is a diagram for showing the result of QBD evaluation of a PMOSFET including, as the gate insulating film, an oxide film formed by the bias plasma oxidation of this embodiment. FIG. 10 is a diagram for showing the result of the QBD evaluation of a PMOSFET including, as the gate insulating film, a conventional thermal oxide film(pyrogenic oxidized at 900°C.). As is understood from comparison between FIGS. 9 and 10, the oxide film formed by the bias plasma oxidation of this embodiment and the thermal oxide film formed by the pyrogenic oxidation at 900° C. have substantially equivalent reliability.

Secondly, as is shown in FIG. 4(c), the protection oxide film 13, whose thickness is made ununiform through the ion implantation and the RCA cleaning, is recovered by the bias plasma oxidation into the protection oxide film 13a with a uniform thickness before the impurity ions are implanted for controlling the threshold voltage. Accordingly, the variation in the threshold voltage of the NMOSFET can be suppressed. In particular, this effect of the invention is remarkably exhibited in a PMOSFET because the threshold voltage of a PMOSFET is largely varied in accordance with change of the impurity concentration.

In a recent semiconductor device designated as a system LSI, such as a device containing both a DRAM and a logic, a variety of transistors are mounted. Therefore, during the photolithography frequently conducted for ion implantation into a variety of transistors, formation and removal of a photoresist mask is repeated. Accordingly, when an oxide film is recovered through the bias plasma oxidation every time the RCA cleaning is carried out for removing a photoresist, the threshold values of the various transistors can be precisely controlled.

Thirdly, in forming the gate electrodes 18a and 18b by patterning the polysilicon film 18 in the procedure shown in FIGS. 6(c) and 6(d), the etching residues 18x remaining on the gate insulating films 17a and 17b and the like are oxidized by the bias plasma oxidation when the etching end point of the polysilicon film is detected. Accordingly, the over-etching can be carried out in removing the gate insulating films 17a and 17b without causing variation in the etching due to the etching residues 18x. Specifically, even when the gate oxide film has a small thickness (of several nm), the surface of the active region can be suppressed from being roughened, so that good silicide layers can be formed in the silicidation conducted in the procedures of FIGS. 7(c) and 7(d).

Figure 25:
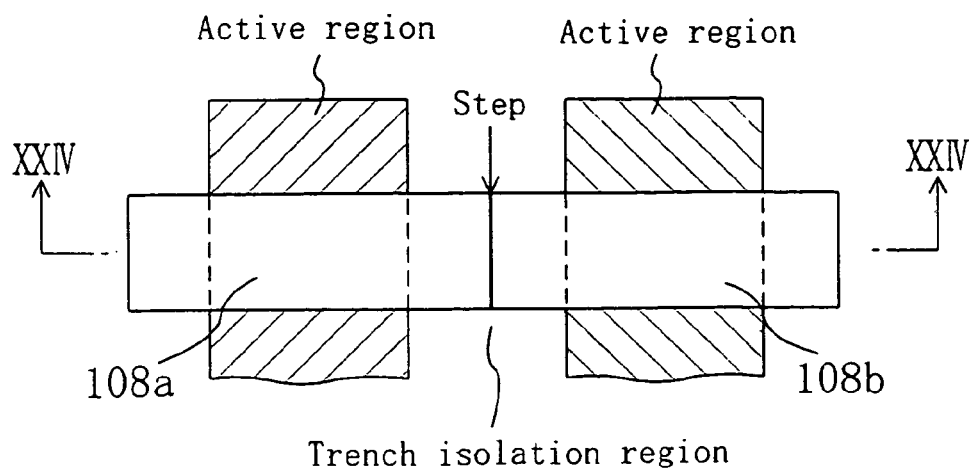
FIG. 25 is a plan view of gate electrodes and a portion below in a conventional CMOS inverter, that is, a semiconductor device.
Figure 26:
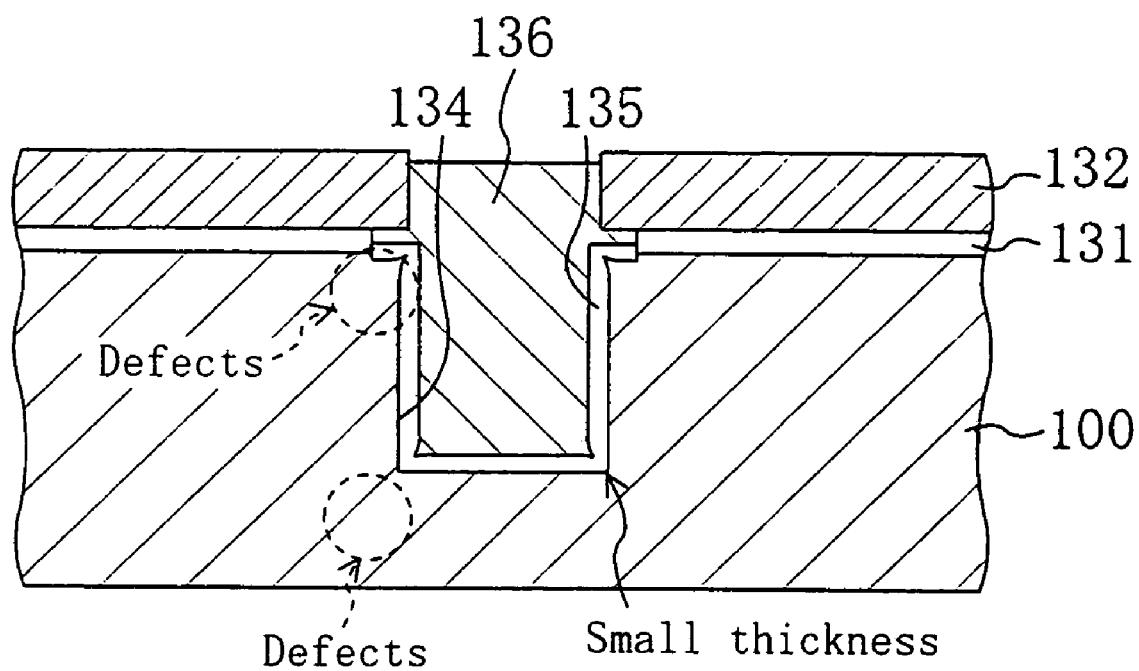
FIG. 26 is a cross-sectional view for showing the shape of a conventional trench isolation region.

Fourthly, as is shown in FIG. 6(a), the step formed between the P-type polysilicon film 108p and the N-type polysilicon film 108n in removing the photoresist film Pr4 or in conducting the cleaning before loading the substrate in a furnace is rounded by using the oxide film 19 formed by the bias plasma oxidation. Accordingly, the problem of the increase in resistance between the gate electrode 18a of the PMOSFET and the gate electrode 18b of the NMOSFET in a CMOS inverter can be solved as follows:

FIGS. 11(a) through 11(e) are sectional views, in the bias plasma oxidation and the silicidation, of the structure of the gate electrodes 18a and 18b alone taken on a section perpendicular to the section of FIG. 6(a) (namely, a section taken on line XXIV-XXIV of FIG. 25).

Figure 11A:
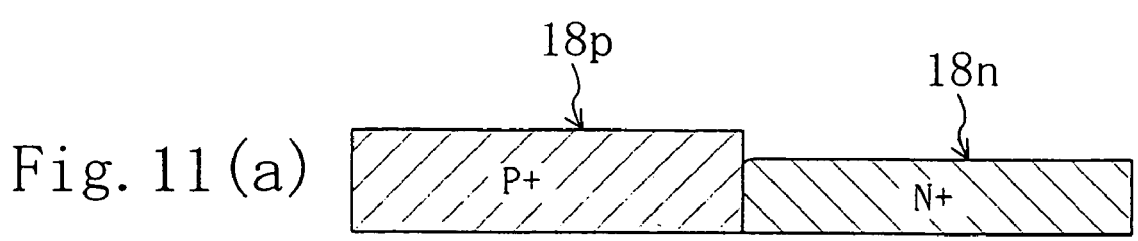
FIGS. 11(a), 11(b), 11(c), 11(d) and 11(e) are cross-sectional views of the structure of the gate electrodes alone in the bias plasma oxidation and silicidation taken on a section perpendicular to the section of FIG. 6(a)
Figure 11B:
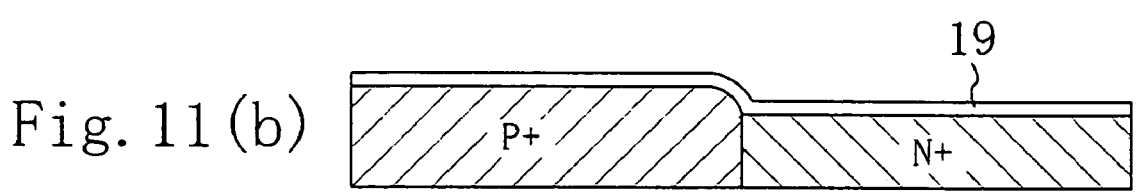

The step formed as is shown in FIG. 11(a) on the boundary between the P-type polysilicon film 18a and the N-type polysilicon film 18b in removing the photoresist film Pr4 or in conducting the cleaning before loading the substrate in a furnace is rounded by using the oxide film 19 formed by the bias plasma oxidation as shown in FIG. 11(b). At this point, a heat treatment at a high temperature as in the thermal oxidation is not conducted, and hence, the distributions of the impurities in the polysilicon films 18a and 18b are not harmfully affected.

Figure 11C:
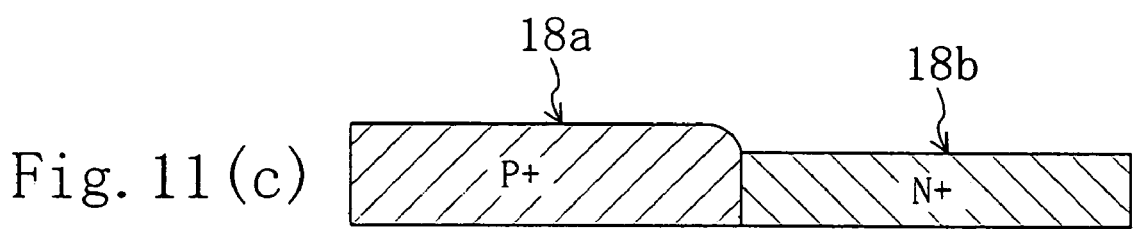
Figure 11D:
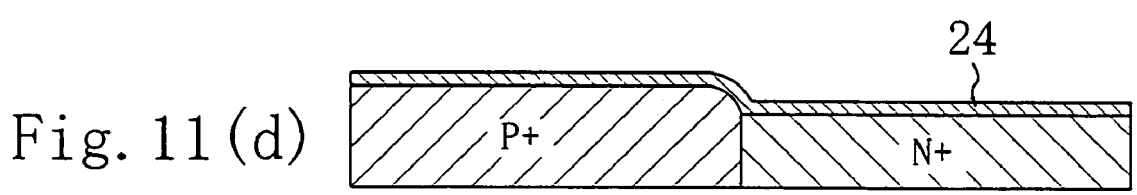
Figure 11E:
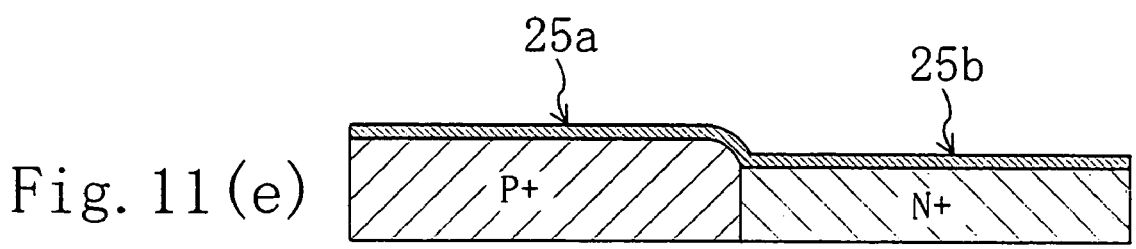

Accordingly, as is shown in FIG. 11(c), there is no abrupt step between the gate electrodes 18a and 18b formed by patterning the polysilicon film in the procedures shown in FIGS. 6(c) and 6(d). As a result, in the procedure shown in FIG. 7(c), the Co film 24 with a substantially uniform thickness can be deposited on the entire polysilicon films forming the gate electrodes 18a and 18b as is shown in FIG. 11(d). Furthermore, in the procedure shown in FIG. 7(d), the $CoSi_2$ films 25a and 25b with a substantially uniform thickness can be formed as is shown in FIG. 11(e). Accordingly, when a voltage is applied to the gate electrode 18b of the NMOSFET in the CMOS inverter, substantially the same voltage can be applied to the gate electrode 18a of the PMOSFET.

Figure 12A:
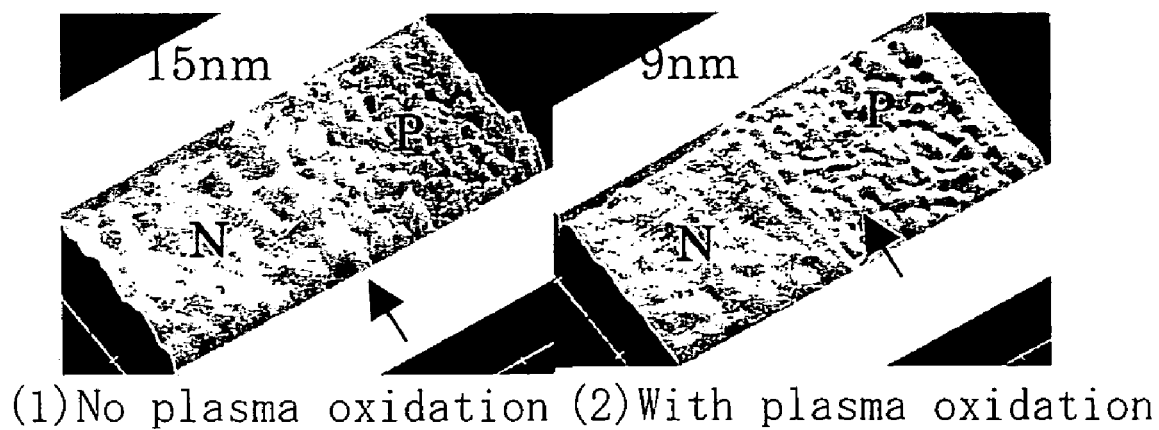
FIGS. 12(a) and 12(b) are respectively a diagram obtained through three-dimensional observation with AFM of a step formed on the surfaces of N-type and P-type polysilicon films after ion implantation and a diagram of minute steps in a section of the N-type and P-type polysilicon films after the ion implantation.
Figure 12B:
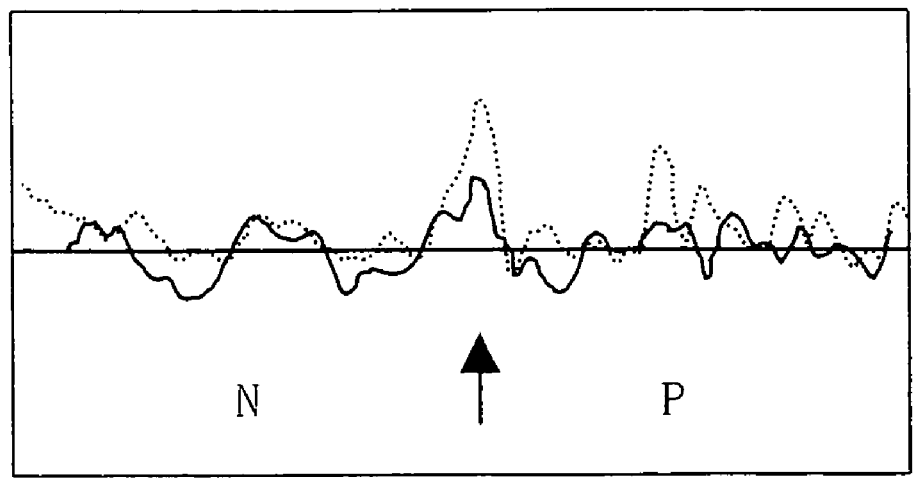

FIG. 12(a) is a diagram of the step formed between the N-type and P-type polysilicon films after the ion implantation obtained through three-dimensional observation with AFM, and FIG. 12(b) is a diagram for showing minute steps formed on one section of the N-type and P-type polysilicon films after the ion implantation. Both FIGS. 12(a) and 12(b) show the surface morphology, in the vicinity of the boundary between the N-type and P-type polysilicon films after the ion implantation, changed by the bias plasma oxidation. As is shown in (1) of FIG. 12(a) and shown with a broken line (as reference) of FIG. 12(b), a step or a projection with a level difference of approximately 15 nm is observed on the boundary between the N-type polysilicon film and the P-type polysilicon film before conducting the bias plasma oxidation. As is shown in (2) of FIG. 12(a) and shown with a solid line of FIG. 12(b), the level difference of the step or the projection is reduced to approximately 9 nm by conducting the bias plasma oxidation. In addition, irregularities are rounded as a whole.

Figure 24A:
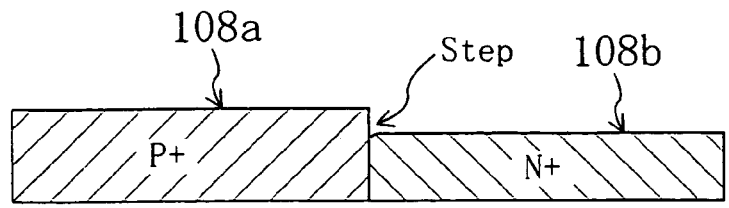
FIGS. 24(a), 24(b) and 24(c) are cross-sectional views of the structure of gate electrodes alone in silicidation taken on a section perpendicular to the section of FIG. 22(d)
Figure 24B:
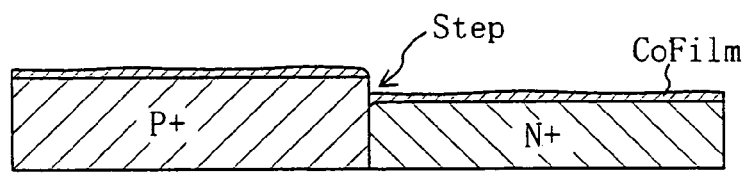
Figure 24C:
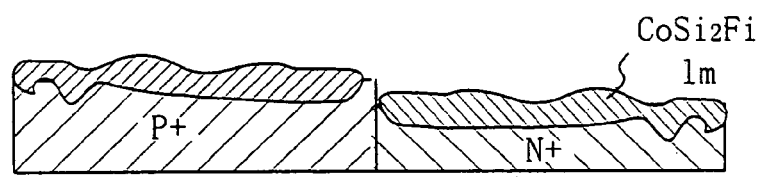

FIG. 13 is a diagram for showing a difference in the electric resistance value of a polycide film depending upon whether or not the bias plasma oxidation (BPO) is conducted. In FIG. 13, the abscissa indicates the resistance value (MΩ) and the ordinate indicates the cumulative relative frequency, whereas measurement data shown at the right end of the graph do not indicate that the electric resistance values are 1.2 MΩ but indicate that the electric resistance values are large beyond the measuring range. As is shown in FIG. 13, the resistance is not largely lowered by siliciding polysilicon without the bias plasma oxidation, while the resistance can be lowered by siliciding a polysilicon film after the bias plasma oxidation. This supports that the bias plasma oxidation can change the state of the step formed on the boundary between the N-type polysilicon film and the P-type polysilicon film as is schematically shown in FIGS. 24(c) and 11(e).

The polysilicon film can be replaced with an amorphous silicon film. In this case, an amorphous silicon film may be subjected to the bias plasma oxidation even though the amorphous silicon film is changed into a polysilicon film through a heat treatment conducted later.

In the procedure shown in FIG. 5(a), after forming the oxide film by the bias plasma oxidation, a heat treatment is conducted before depositing the polysilicon film for the gate electrodes. Therefore, the oxide film or the like formed by using the bias plasma can attain uniform quality and carbon contamination on the oxide film or the like can be removed, resulting in improving the reliability of the oxide film or the like.

Furthermore, in the case where the bias plasma oxidation is carried out in an atmosphere including oxygen and nitrogen, the atmosphere may be obtained by mixing $N_2O$, $N_2$, NO or the like with an $O_2$ gas. When the bias plasma oxidation is carried out in such an atmosphere including nitrogen, nitrogen can be bonded to an unbonded bond of Si present in the oxide film or the interface between the Si substrate and the oxide film, resulting in forming a nitrided oxide film. In this manner, a nitrided oxide film where nitrogen is comparatively uniformly distributed can be obtained, and hence, when such a nitrided oxide film is used as a gate insulating film, the function to prevent the variation in the threshold voltage derived from punch-through of the impurity, particularly boron, from the gate electrode into the Si substrate can be advantageously improved. Among the gases including nitrogen, the NO gas is more preferably used because a NO gas molecule is the smallest so that a nitrogen atom can be easily introduced into the film. A nitrided oxide film has a function to prevent diffusion of boron, and can suppress the variation in the threshold voltage.

In a MOSFET having the STI (shallow trench isolation) structure, when the gate oxide film is formed by the thermal oxidation, the thickness of the gate oxide film is varied depending upon the surface orientation of the underlying Si substrate. The Si substrate at the edge of the STI has the (111) surface orientation, and the thickness of the oxide film in this position is small. Therefore, when a voltage is applied to the gate electrode, the electric field is collected on the edge portion of the STI where the oxide film is thin, resulting in degrading the reliability of the gate oxide film. The thickness of the oxide film formed by the bias plasma oxidation of this invention, however, does not depend upon the surface orientation of the Si substrate, and hence, the reliability the oxide film is not degraded due to the thinning.

EMBODIMENT 2

FIGS. 14(a) through 14(d) and 15(a) through 15(c) are sectional views for showing procedures in fabrication of a CMOS device having a polymetal gate or polycide gate structure according to Embodiment 2. In this embodiment, the procedures after completing the patterning of the gate insulating film and the gate electrodes will be described, and the previous procedures are omitted. Prior to the procedure of FIG. 14(a), procedures including the bias plasma oxidation as in the procedures of FIGS. 4(a) through 4(d) of Embodiment 1 may be conducted, or procedures not including the bias plasma oxidation as in the conventional fabrication method may be conducted.

Figure 14A:
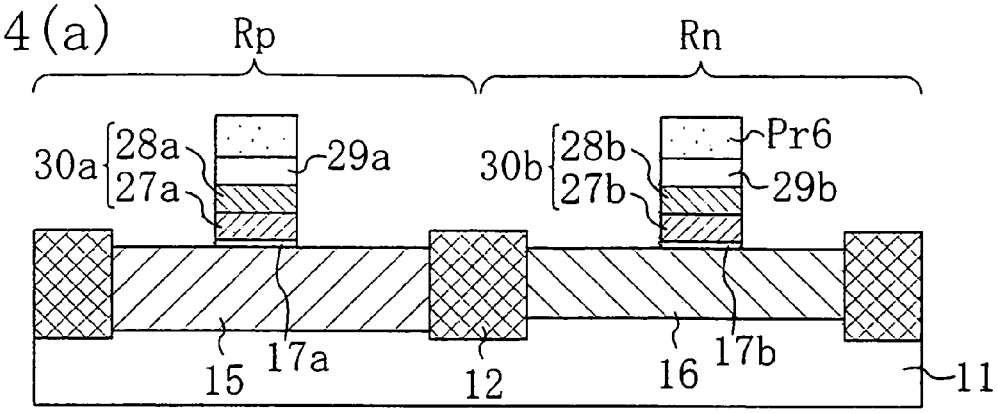
FIGS. 14(a), 14(b), 14(c) and 14(d) are cross-sectional views for showing first half procedures in fabrication of a CMOS device having a polymetal gate structure and the like according to Embodiment 2.

In the procedure shown in FIG. 14(a), a trench isolation region 12 for isolating a PMOSFET formation region Rp and an NMOSFET formation region Rn from each other has been formed in a Si substrate 11. In the PMOSFET formation region Rp, an N-type well region 15, a gate insulating film 17a, a bottom electrode 27a of polysilicon, a top electrode 28a of a metal such as tungsten and titanium silicide, and an over-gate protection film 29a of silicon oxide are formed, and the bottom electrode 27a and the top electrode 28a together form a gate electrode 30a of the polymetal structure. In the NMOSFET formation region Rn, a P-type well region 16, a gate insulating film 17b, a bottom electrode 27b of polysilicon, a top electrode 28b of a metal such as tungsten and titanium silicide, and an over-gate protection film 29b of silicon oxide are formed, and the bottom electrode 27b and the top electrode 28b together form a gate electrode 30b of the polymetal structure. Each of these gate electrodes 30a and 30b of the polymetal structure is formed by successively depositing a polysilicon film, a tungsten film or the like and a silicon oxide film on the substrate, forming a photoresist film Pr6 covering a gate formation region by the photolithography, and conducting dry etching by using the photoresist film Pr6 as a mask.

Figure 14B:
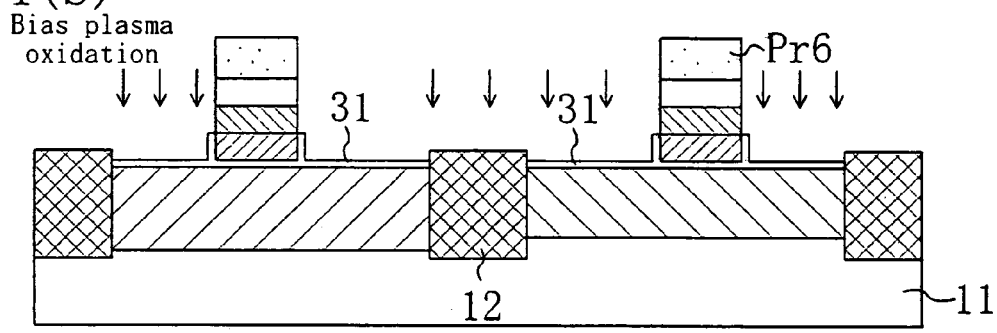

Next, in the procedure shown in FIG. 14(b), with the photoresist film Pr6 kept, the bias plasma oxidation is carried out for 5 minutes in an atmosphere including oxygen (or oxygen and nitrogen) at a substrate temperature of 180° C. and bias power of 1000 W. Thus, a contamination protection insulating film 31 of an oxide film (or a nitrided oxide film) with a thickness of approximately 6 nm is formed over a surface of the Si substrate 11 exposed in the active region and the side faces of the bottom electrodes 27a and 27b.

Figure 14C:
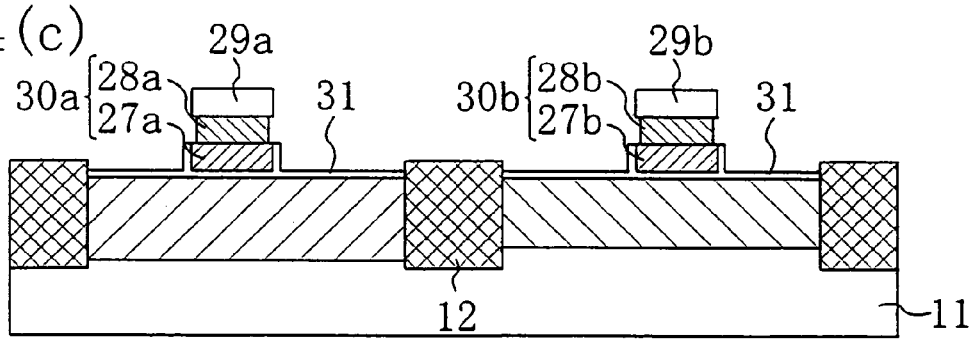

Then, in the procedure shown in FIG. 14(c), the photoresist film Pr6 is removed by the ashing or the RCA cleaning. At this point, the side faces of the top electrodes 28a and 28b made from the metal such as tungsten is etched to sink. The surface of the Si substrate 11 in the active region is, however, covered with the contamination protection insulating film 31, and hence, metal ions dissolved in the cleaning solution used in the RCA cleaning can be prevented from entering the Si substrate 11 due to the etching of the top electrodes 28a and 28b.

Figure 14D:
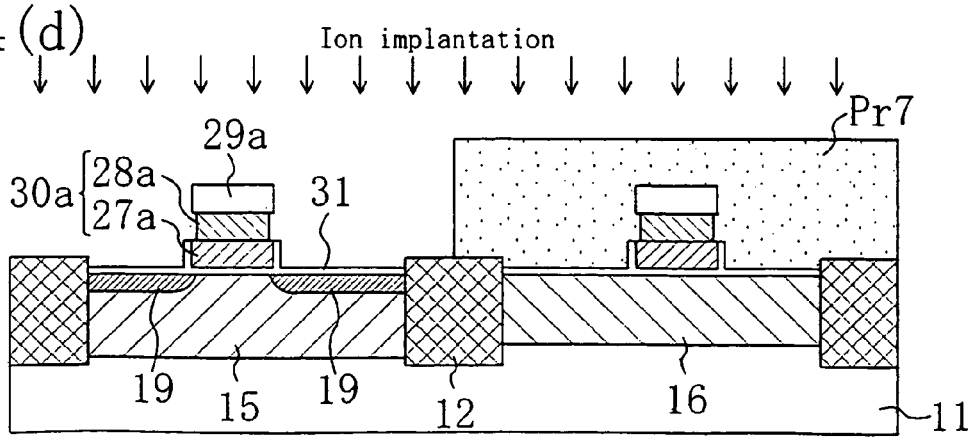

Next, in the procedure shown in FIG. 14(d), a photoresist film Pr7 covering the NMOSFET formation region Rn and having an opening on the PMOSFET formation region Rp is formed, and P-type impurity ions are implanted by using the photoresist film Pr7, the gate electrode 30a of the PMOSFET and the like as masks, thereby forming low concentration source/drain regions 19 of the PMOSFET. Thereafter, the photoresist film Pr7 is removed by the ashing and the RCA cleaning. At this point, since the contamination protection insulating film 31 is also etched by the RCA cleaning, the bias plasma oxidation is preferably carried out after removing the photoresist film Pr7, so as to recover the thickness of the contamination protection insulating film 31.

Figure 15A:
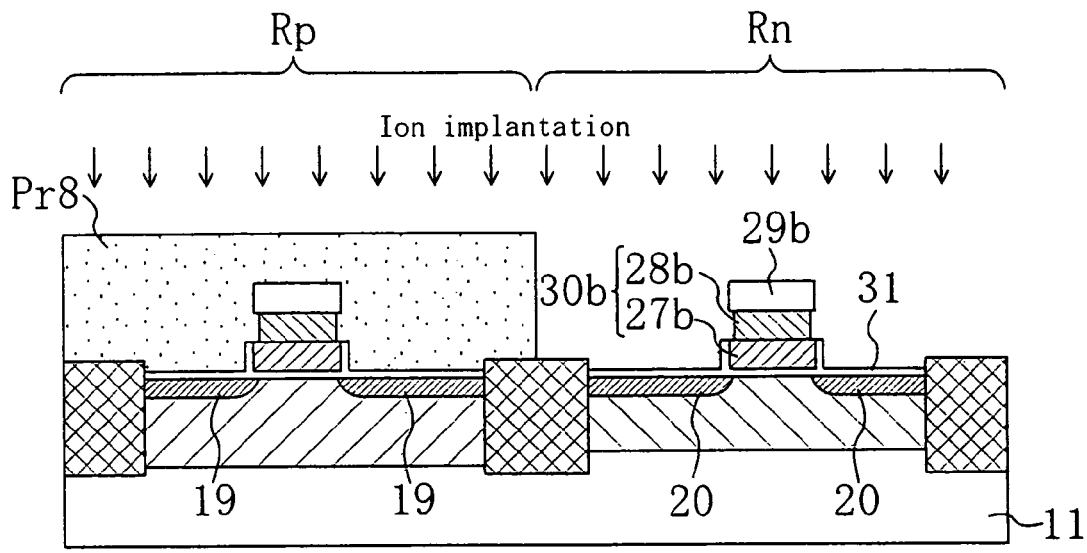
FIGS. 15(a), 15(b) and 15(c) are cross-sectional views for showing second half procedures in the fabrication of the CMOS device having the polymetal gate structure and the like of Embodiment 2.

Subsequently, in the procedure shown in FIG. 15(a), a photoresist film Pr8 covering the PMOSFET formation region Rp and having an opening on the NMOSFET formation region Rn is formed, and N-type impurity ions are implanted by using the photoresist film Pr8, the gate electrode 30b of the NMOSFET and the like as masks, thereby forming low concentration source/drain regions 20 of the NMOSFET. Thereafter, the photoresist film Pr8 is removed by the ashing and the RCA cleaning. At this point, since the contamination protection insulating film 31 is also etched by the RCA cleaning, the bias plasma oxidation is preferably carried out after removing the photoresist film Pr8, so as to recover the thickness of the contamination protection insulating film 31.

Figure 15B:
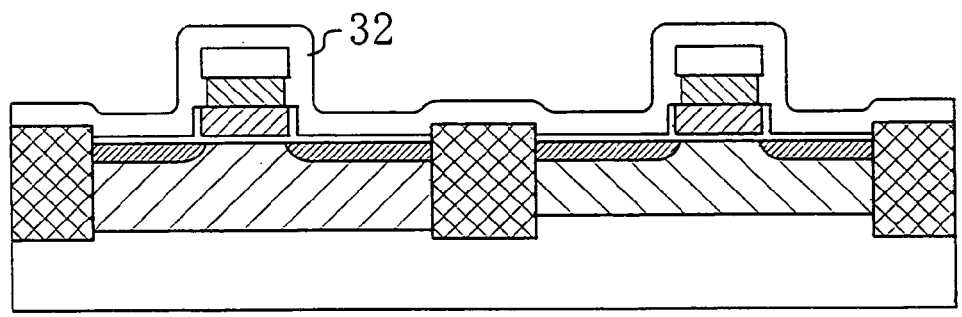
Figure 15C:
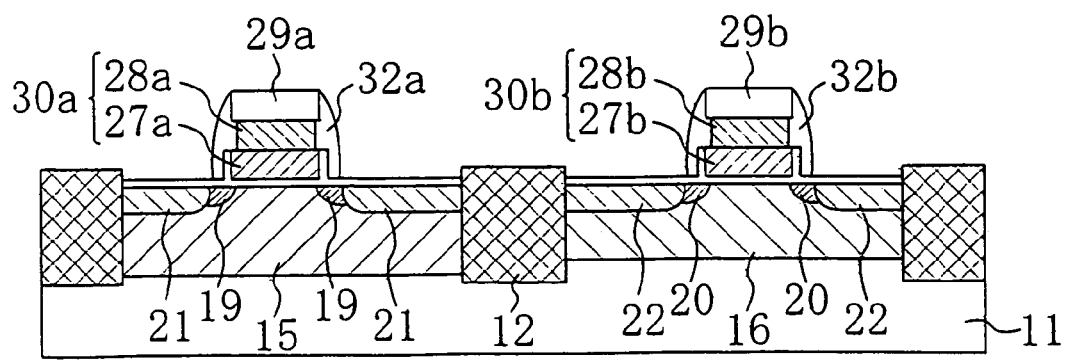

Next, in the procedure shown in FIG. 15(b), a silicon oxide film 32 is deposited on the substrate, and in the procedure shown in FIG. 15(c), the silicon oxide film 32 is etched back, thereby forming oxide film sidewalls 32a and 32b on the side faces of the over-gate protection films 29a and 29b and the gate electrodes 30a and 30b of the MOSFETs. Thereafter, although not shown in the drawing, a photoresist film covering the NMOSFET formation region Rn and having an opening on the PMOFET formation region Rp is formed, and P-type impurity ions are implanted by using the photoresist film and the gate electrode 30a and the oxide film sidewall 32a of the PMOSFET as masks, thereby forming high concentration source/drain regions 21 of the PMOSFET. Subsequently, a photoresist film covering the PMOSFET formation region Rp and having an opening on the NMOSFET formation region Rn is formed, and N-type impurity ions are implanted by using the photoresist film and the gate electrode 30b and the oxide film sidewall 32b of the NMOSFET as masks, thereby forming high concentration source/drain regions 22 of the NMOSFET.

Thereafter, after removing the contamination protection insulating film 31 on the high concentration source/drain regions 21 and 22, silicide films may be formed on the high concentration source/drain regions 21 and 22 by depositing a refractory metal film of Co or the like and causing a reaction between the refractory metal and the Si substrate 11.

In the fabrication method of this embodiment, before removing the photoresist film Pr6 by the ashing and the RCA cleaning, the contamination protection insulating film 31 is formed by the bias plasma oxidation with the photoresist film Pr6 kept as is shown in FIG. 14(c). Therefore, even when the top electrodes 28a and 28b are etched in removing the photoresist film Pr6 thereafter in the procedure of FIG. 14(c), the metal ions included in the top electrodes 28a and 28b can be suppressed from entering the Si substrate 11. Accordingly, junction leakage derived from the metal ions entering the Si substrate 11 can be effectively suppressed. As a significant characteristic of the bias plasma oxidation conducted at this point, there is no need to remove the photoresist film Pr6 because this bias plasma oxidation is carried out at a low temperature of 200° C. or less. In other words, the contamination protection insulating film 31 for protecting the surface of the Si substrate 11 can be formed without generating debris accompanied by the removal of the photoresist film Pr6.

Also, since oxidation is conducted at a low temperature by using the bias plasma oxidation, the source/drain regions can be prevented from being etched by the RCA cleaning for removing the photoresist film, and thus, the sheet resistance is definitely prevented from increasing.

In addition, since the bias plasma oxidation is carried out at a low temperature of 200° C. or less, the top electrodes 28a and 28b made from the metal are never oxidized.

Furthermore, the bias plasma oxidation carried out at a low temperature has another advantage that the junction profile formed before the bias plasma oxidation by the ion implantation for forming a well region or the like is never changed.

The invention is applicable to fabrication of all kinds of semiconductor devices having a gate electrode including a metal, such as agate electrode of the polymetal structure, a gate electrode of the polycide structure, and a gate electrode having a metal structure.

Now, a modification of Embodiment 2 will be described. In this modification, a nitride film sidewall is formed instead of the oxide film sidewall.

Figure 16:
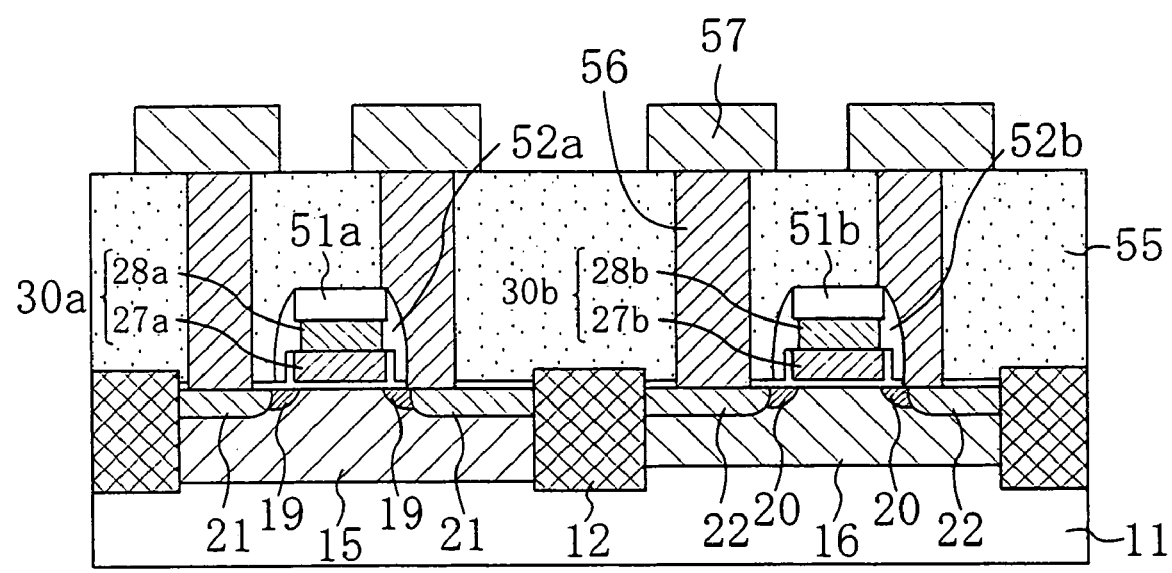
FIG. 16 is a cross-sectional view of a CMOS device having a SAC structure according to modification of Embodiment 2.

FIG. 16 is a sectional view of a CMOS device fabricated in this modification. In this modification, the PMOSFET and the NMOSFET are formed through the basically same procedures as those shown in FIGS. 14(a) through 14(d) and 15(a) through 15(c), whereas over-gate protection films 51a and 51b of a nitride film are formed instead of the over-gate protection films 29a and 29b of the oxide film and nitride film sidewalls 52a and 52b are formed instead of the oxide film sidewalls 32a and 32b. The other elements are formed through the same procedures as those shown in FIGS. 14(a) through 14(d) and 15(a) through 15(c).

In this modification, after the procedure shown in FIG. 15(c), an interlayer insulating film 55 of a BPSG film is deposited on the substrate, contact holes respectively in contact with the high concentration source/drain regions 21 and 22 are formed through the interlayer insulating film 55, and a plug 56 is formed by filling each contact hole with a tungsten film with a barrier film of titanium nitride or the like sandwiched therebetween. Furthermore, a line layer 57 of an aluminum alloy film connected to each plug 56 is formed on the interlayer insulating film 55.

At this point, owing to the over-gate protection films 51a and 51b of the nitride film and the nitride film sidewalls 52a and 52b, each contact hole never reaches the gate electrode 30a or 30b even if it is formed in a region overlapping the gate electrode 30a or 30b. In other words, there is no need to provide a mask for forming the contact hole with a margin in consideration of alignment shift against a mask for forming a gate electrode, but the so-called SAC (self-aligned contact) process can be applied.

In this modification, a contamination protection film 31 is formed merely on the side faces of the bottom electrodes 27a and 27b and the top face of the Si substrate 11 by the bias plasma oxidation without harmfully affecting the characteristic of the top electrodes 28a and 28b of the metal film as is shown in FIG. 14(b). Thus, although the nitride film sidewalls 52a and 52b are formed thereon, the application of stress to the channel region or the like due to the nitride film can be definitely suppressed. Accordingly, even though the nitride film sidewalls 52a and 52b are formed, the electric characteristics of the PMOSFET and the NMOSFET can be satisfactorily kept.

In a know fabrication method for a CMOS device having a gate electrode of the polymetal structure or the polycide structure, a nitride film sidewall is formed on the side faces of the gate electrode and the over-gate protection film of a nitride film with an oxide film sidewall sandwiched therebetween. In this conventional fabrication method, however, the following problem arises in forming a contact in a self-alignment manner: When a contact hole is formed over the gate electrode, the upper portion of the nitride film sidewall with a very small thickness can be easily etched, and the oxide film sidewall can be etched in that portion, so that the contact hole can reach the gate electrode (top electrode). Accordingly, in order to definitely prevent electric short-circuit between the source/drain region and the gate electrode, the SAC process is difficult to employ in the conventional method.

In contrast, in the CMOS device formed by the fabrication method of this modification, the over-gate protection film 51a or 51b of the nitride film is in contact with the nitride film sidewall 52a or 52b in a portion corresponding to the thickness of the over-gate protection film 51a or 51b. Therefore, even when a contact hole is formed over the gate electrode, the contact hole can be definitely prevented from reaching the gate electrode. In addition, the nitride film sidewalls 52a and 52b can be formed in a small thickness, and hence, the MOSFETs can be easily refined. In other words, this fabrication method provides a CMOS device having the polymetal gate or polycide structure and the SAC structure, with advantage in refinement.

EMBODIMENT 3

FIGS. 17(a) through 17(c) and 18(a) through 18(c) are sectional views for showing procedures in fabrication of a CMOS device having the salicide structure according to Embodiment 3. In this embodiment, procedures after completing the patterning of the gate insulating film and the gate electrodes will be described, and the previous procedures are omitted. Prior to the procedure shown in FIG. 17(a), procedures including the bias plasma oxidation as in those of Embodiment 1 shown in FIGS. 4(a) through 4(d) may be conducted, or procedures not including the bias plasma oxidation of this invention as in the conventional fabrication method may be conducted.

Figure 17A:
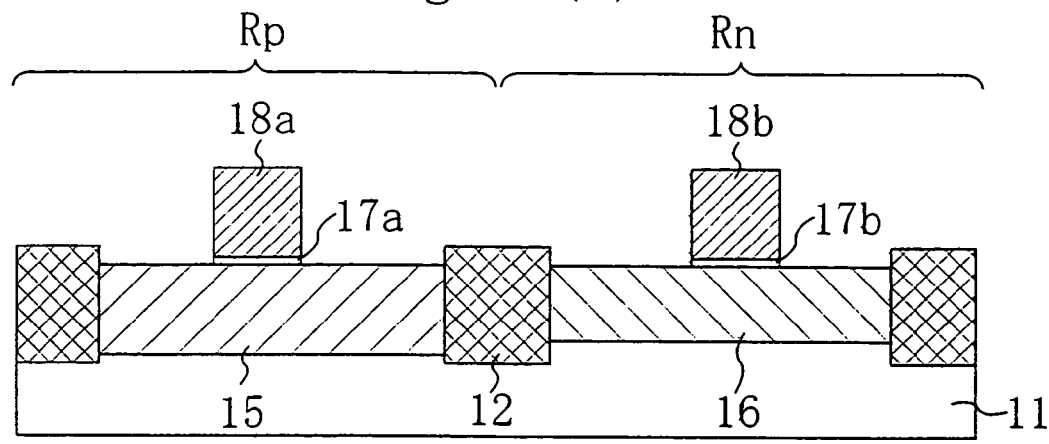
FIGS. 17(a), 17(b) and 17(c) are cross-sectional views for showing first half procedures in fabrication of a CMOS device having a salicide structure according to Embodiment 3.

In the procedure shown in FIG. 17(a), a trench isolation region 12 for isolating the PMOSFET formation region Rp and the NMOSFET formation region Rn from each other has been formed in a Si substrate 11. In the PMOSFET formation region Rp, an N-type well region 15, a gate insulating film 17a and a gate electrode 18a of polysilicon are formed. In the NMOSFET formation region Rn, a P-type well region 16, a gate insulating film 17b and a gate electrode 18b of polysilicon are formed.

Figure 17B:
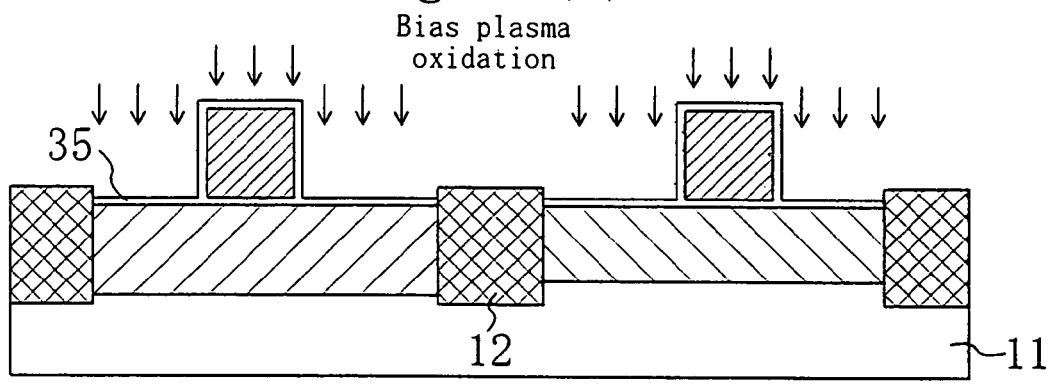

Next, in the procedure shown in FIG. 17(b), the bias plasma oxidation is carried out for 5 minutes in an atmosphere including oxygen at a substrate temperature of 180° C. and bias power of 1000 W, thereby forming a coat oxide film 35 with a thickness of approximately 6 nm over a surface of the Si substrate 11 exposed in the active region and the side and top faces of the gate electrodes 18a and 18b. This bias plasma oxidation can be carried out at approximately 300°C.

Figure 17C:
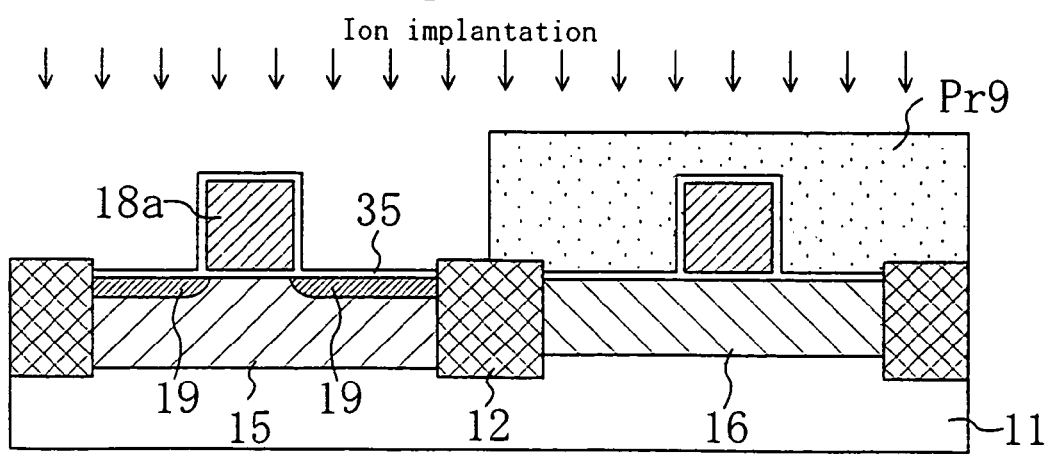

Then, in the procedure shown in FIG. 17(c), a photoresist film Pr9 covering the NMOSFET formation region Rn and having an opening on the PMOSFET formation region Rp is formed, and boron fluoride ($BF_2^+$) (or boron ($B^+$)) ions are implanted by using the photoresist film Pr9 and the gate electrode 18a of the PMOSFET as masks at implantation energy of 8 keV and a dose of $1\times10^{13}$ through $1\times10^{14}$ cm$^{-2}$, thereby forming low concentration source/drain regions 19 of the PMOSFET. Thereafter, the photoresist film Pr9 is removed by the ashing and the RCA cleaning. The removal of the photoresist film Pr9 by the ashing is conducted as a process for applying plasma in an oxygen gas atmosphere, namely, in a similar process to the bias plasma oxidation, but the bias power is lowered in the ashing than in the bias plasma oxidation conducted in the procedure of FIG. 17(b). In this manner, the coat insulating film 35 formed in the procedure of FIG. 17(c) can be prevented from increasing in its thickness through oxidation. In other words, the impurity profile can be prevented from being changed by the oxide film abrading the low concentration source/drain regions 19 formed in the Si substrate 11, and hence, the change or degradation of the electric characteristic of the MOSFET derived from the change of the impurity profile can be avoided.

In the RCA cleaning following the ashing, the low concentration source/drain regions 19 are not etched because they are covered with the coat insulating film 35, resulting in preventing the resistance of the low concentration source/drain regions 19 from increasing.

Subsequently, in the procedure shown in FIG. 18(a), a photoresist film Pr10 covering the PMOSFET formation region Rp and having an opening on the NMOSFET formation region Rn is formed, and arsenic ($As^+$) (or phosphorus ($P^+$)) ions are implanted by using the photoresist film Pr10 and the gate electrode 18b of the NMOSFET as masks at implantation energy of 10 keV and a dose of $1\times10^{13}$ through $1\times10^{14}$ cm$^{-2}$, thereby forming low concentration source/drain regions 20 of the NMOSFET. Thereafter, the photoresist film Pr10 is removed by the ashing and the RCA cleaning. Also in removing the photoresist film Pr10 by the ashing, the bias power is lowered than in the bias plasma oxidation conducted in the procedure of FIG. 17(b). In this manner, the coat insulating film 35 is prevented from increasing in its thickness by the oxidation, so that the change or degradation of the electric characteristic of the MOSFET derived from the change of the impurity profile in the low concentration source/drain regions 20 can be avoided.

Thereafter, before loading the substrate in an electric furnace, the RCA cleaning is carried out again for removing particles. However, after removing the photoresist film Pr10, the bias plasma oxidation is preferably carried out before the cleaning for removing particles so as to recover the thickness of the coat oxide film 35. This is because the coat oxide film 35 is etched in the RCA cleaning.

Figure 18A:
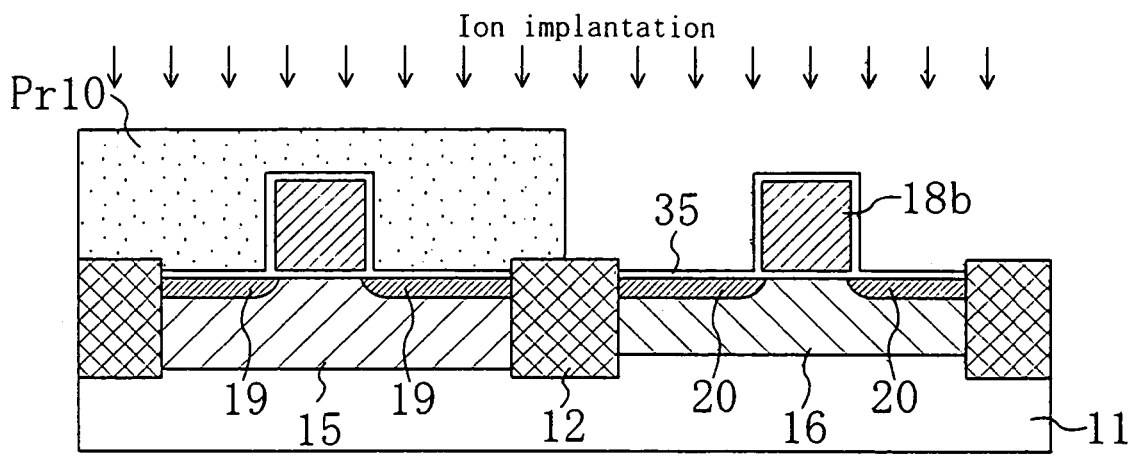
FIGS. 18(a), 18(b) and 18(c) are cross-sectional views for showing second half procedures in the fabrication of the CMOS device having the salicide structure of Embodiment 3.
Figure 18B:
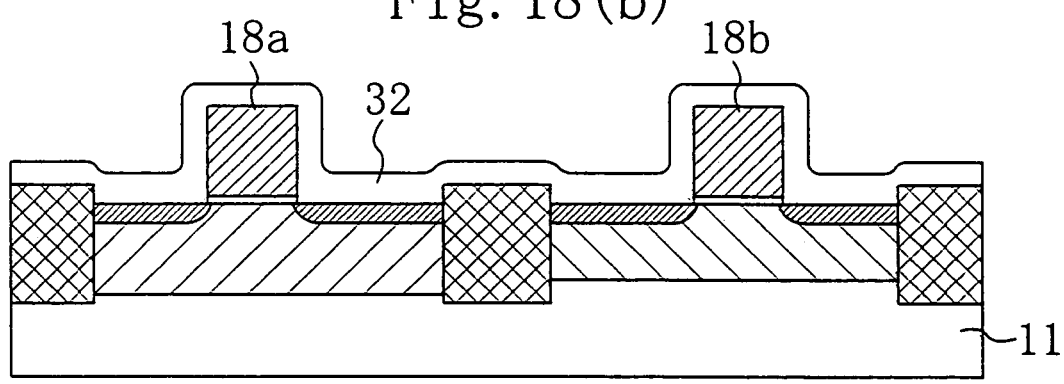

Next, in the procedure shown in FIG. 18(b), after the cleaning for removing particles, the coat oxide film 35 is removed, and a silicon oxide film 32 is deposited on the substrate. In conducting the RCA cleaning for removing particles, if the coat oxide film scarcely remains on the semiconductor active region, a bias plasma insulating film is formed before the cleaning.

Figure 18C:
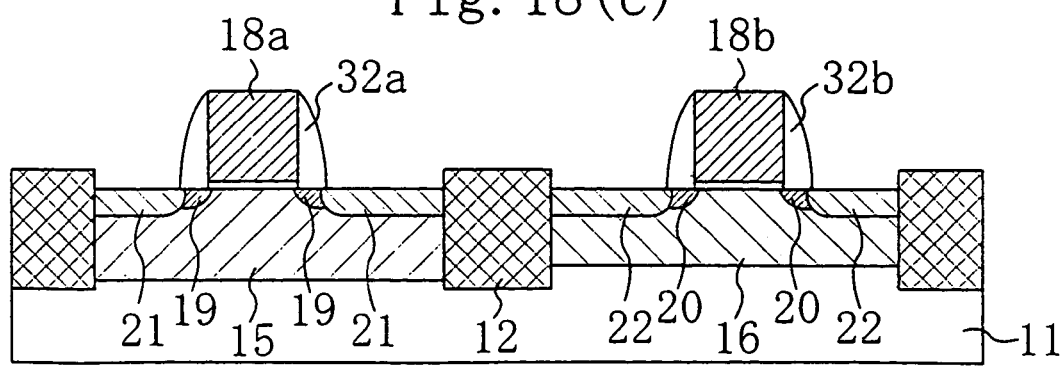

Then, in the procedure shown in FIG. 18(c), the silicon oxide film 32 is etched back, thereby forming oxide film sidewalls 32a and 32b on the side faces of the gate electrodes 18a and 18b of the MOSFETs. Thereafter, although not shown in the drawing, a photoresist film covering the NMOSFET formation region Rn and having an opening on the PMOSFET formation region Rp is formed, and P-type impurity ions are implanted by using the photoresist film and the gate electrode 18a and the oxide film sidewall 32a of the PMOSFET as masks, thereby forming high concentration source/drain regions 21 of the PMOSFET. Subsequently, a photoresist film covering the PMOSFET formation region Rp and having an opening on the NMOSFET formation region Rn is formed, and N-type impurity ions are implanted by using the photoresist film and the gate electrode 18b and the oxide film sidewall 32b of the NMOSFET as masks, thereby forming high concentration source/drain regions 22 of the NMOSFET.

Thereafter, the salicidation is conducted, which is omitted because it is the same as that described in Embodiment 1.

In the fabrication method of this embodiment, in forming the coat insulating film 35 for covering the gate electrodes 18a and 18b in the procedure shown in FIG. 17(b), the oxidation is conducted at a low temperature by using the bias plasma oxidation. Accordingly, the sheet resistance can be avoided from increasing due to the source/drain region etched by the RCA cleaning for removing the photoresist film.

In addition, the boron can be prevented from diffusing from the gate electrode 18a of the PMOSFET through the gate oxide film 17a into the N-type well region 15 as in a heat treatment conducted at 900 through 1000° C. for forming an oxide film by the conventional thermal oxidation. Also, in the STI structure, displacement derived from a high temperature heat treatment can be prevented from occurring in the substrate. In this manner, the degradation in the reliability and the increase of the variation in the threshold voltage of the PMOSFET can be prevented. Also, the change of the impurity profile in the substrate can be suppressed.

Furthermore, the ashing for removing the photoresist films Pr9 and Pr10 of FIGS. 17(c) and 18(a) is carried out at bias power lower than in the bias plasma oxidation conducted in the procedure of FIG. 17(b). Therefore, the coat insulating film 35 formed in the procedure of FIG. 17(c) can be prevented from increasing in its thickness by the oxidation. In other words, it is possible to overcome a problem that a portion with a peak concentration in the low concentration source/drain region 19 or 20 is changed into an oxide film because of the oxide film eroding the low concentration source/drain region 19 or 20 formed in the Si substrate 11. Therefore, the change or degradation of the electric characteristic of the MOSFET derived from the change of the impurity profile can be avoided.

FIGS. 19(a) and 19(b) are diagrams for showing the Ion-Ioff characteristics of the PMOSFET and the NMOSFET formed in this embodiment. In FIGS. 19(a) and 19(b), the abscissa indicates a saturation current Ion (μA) of the MOSFET and the ordinate indicates an off leakage current Ioff. In these drawings, data of a MOSFET as a comparative example where a coat insulating film is not formed by the bias plasma oxidation are shown with white circles, and data of the MOSFET of this embodiment where the coat insulating film is formed by the bias plasma oxidation are shown with black triangles. It is understood from FIGS. 19(a) and 19(b) that the off leakage current is further lowered against the same saturation current in the MOSFET of this embodiment than in the MOSFET of the comparative example. In other words, the so-called off-leakage characteristic is improved in the MOSFET of this embodiment.

EMBODIMENT 4

Figure 20A:
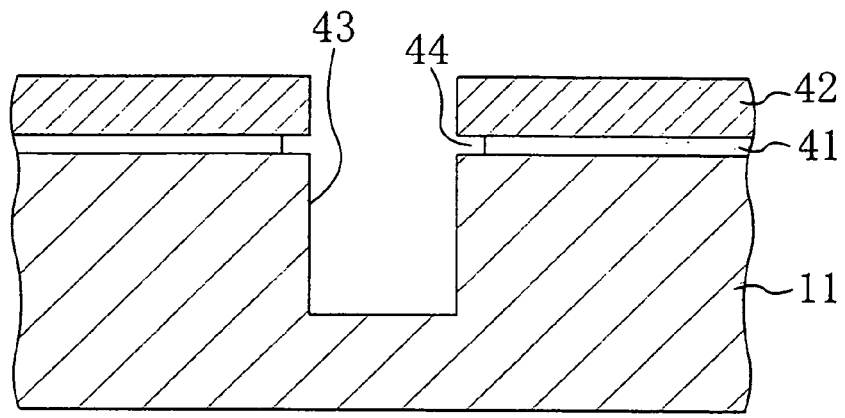
FIGS. 20(a), 20(b) and 20(c) are cross-sectional views for showing part of procedures for forming a trench isolation region of a semiconductor device according to Embodiment 4.
Figure 20B:
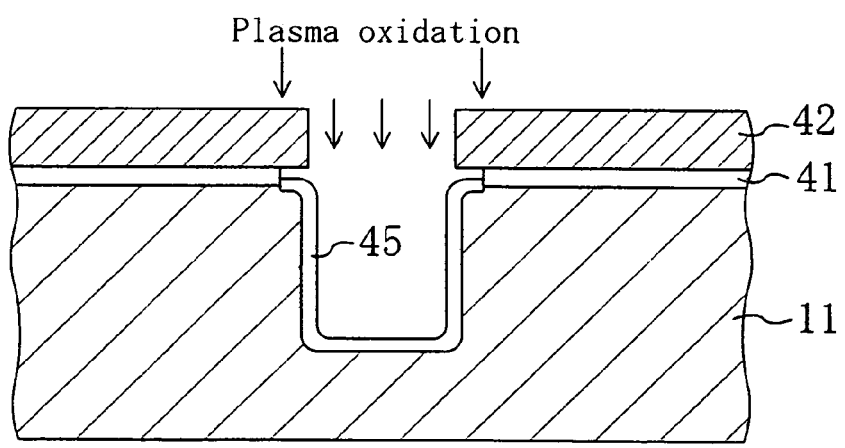
Figure 20C:
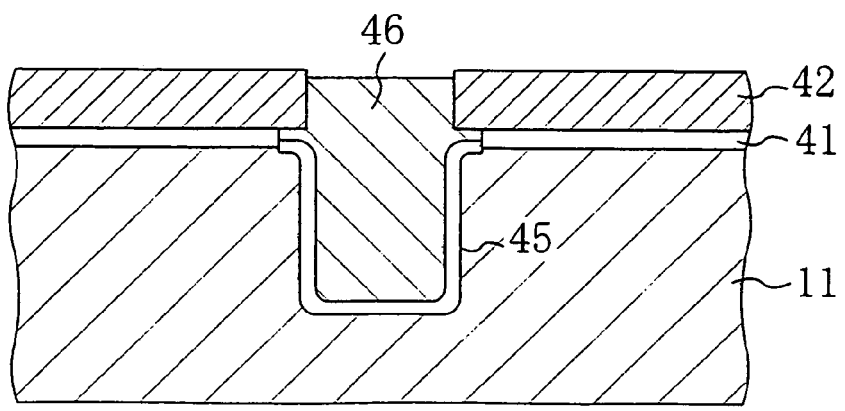
Figure 21A:
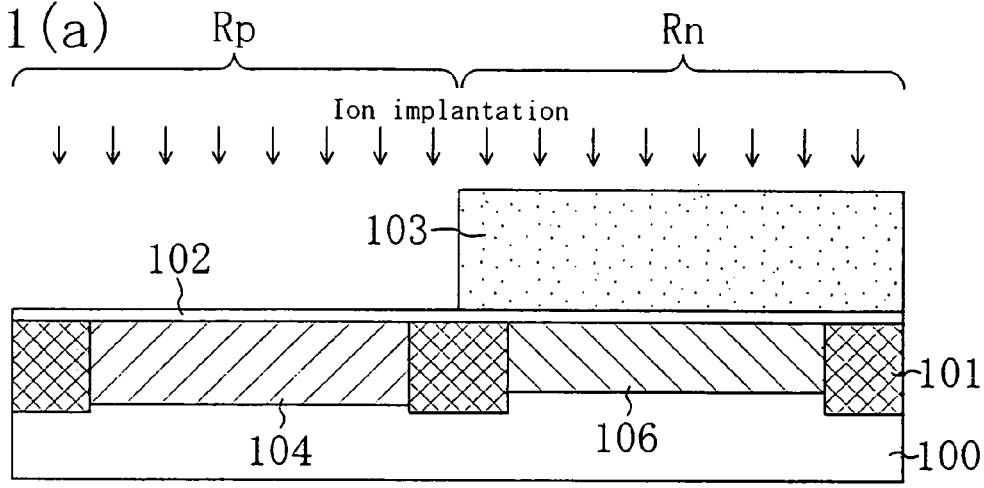
FIGS. 21(a), 21(b), 21(c) and 21(d) are cross-sectional views for showing first half procedures in fabrication of a conventional CMOS device having a trench isolation structure and a dual gate structure.
Figure 21B:
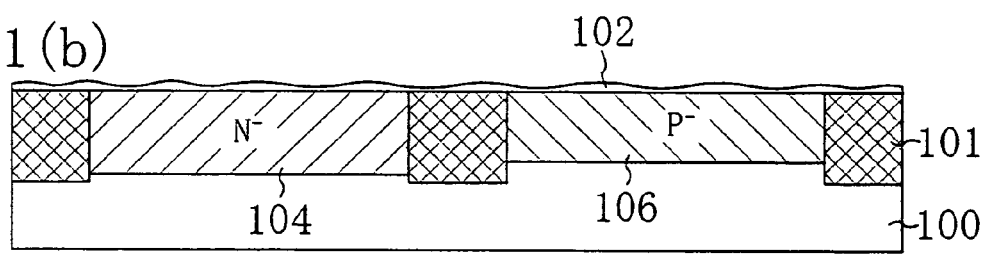
Figure 21C:
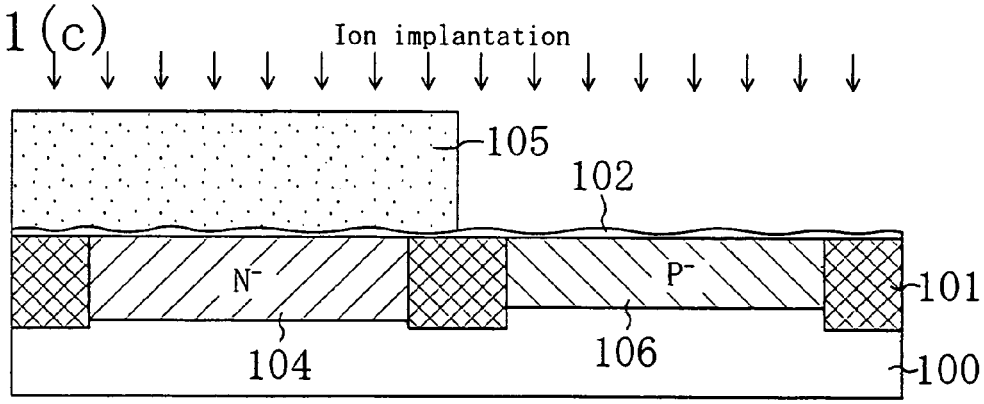
Figure 21D:
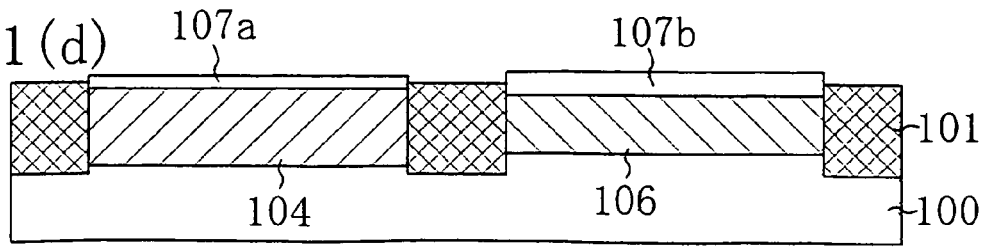
Figure 22A:
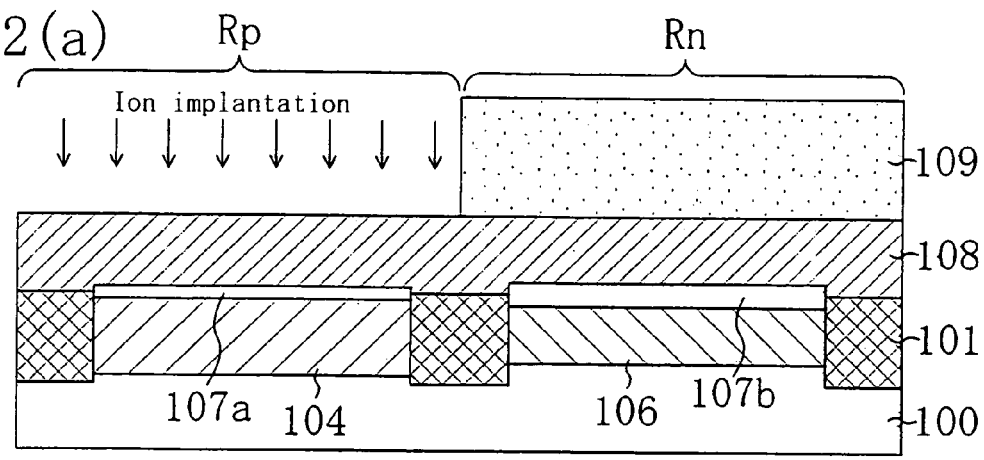
FIGS. 22(a), 22(b), 22(c) and 22(d) are cross-sectional views for showing second half procedures in the fabrication of the conventional CMOS device having the trench isolation structure and the dual gate structure.
Figure 22B:
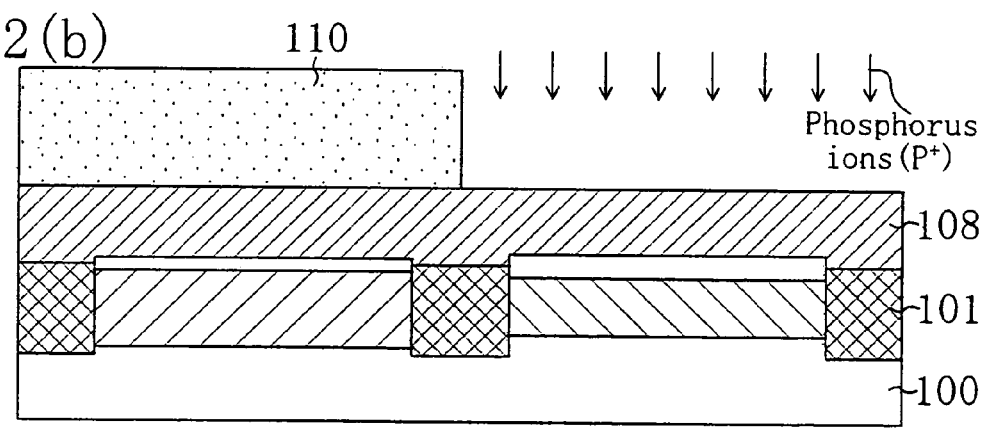
Figure 22C:
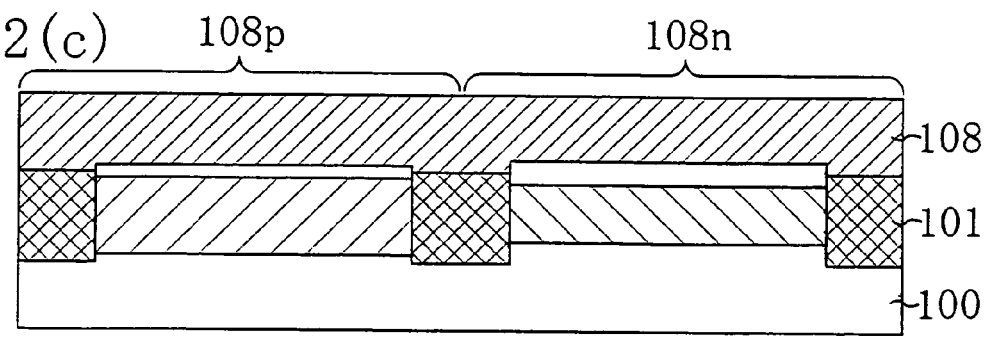
Figure 22D:
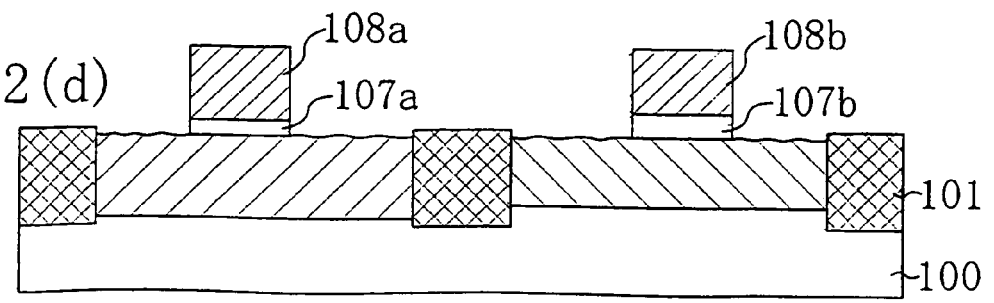
Figure 23A:
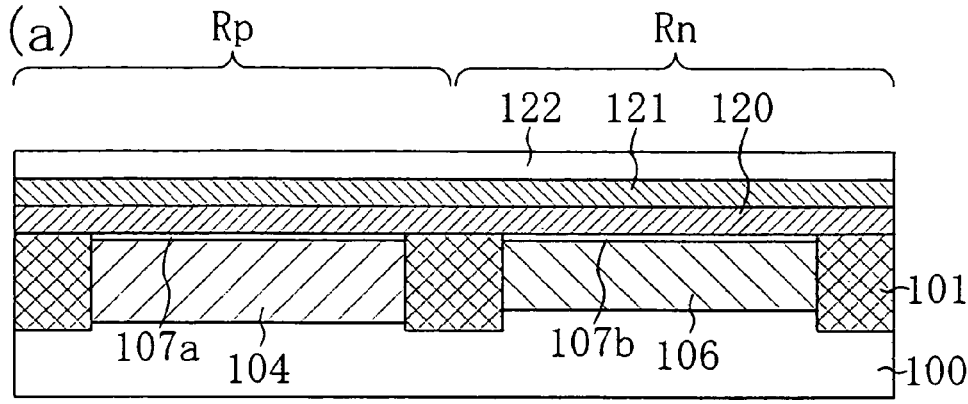
FIGS. 23(a), 23(b), 23(c) and 23(d) are cross-sectional views for showing procedures in fabrication of a conventional CMOS device having a polymetal structure.
Figure 23B:
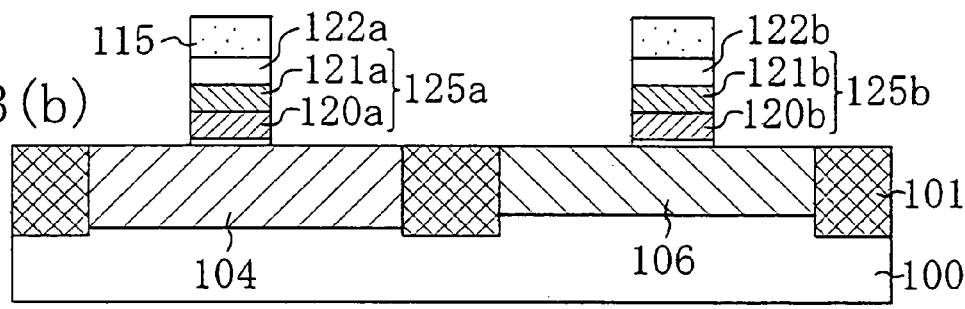
Figure 23C:
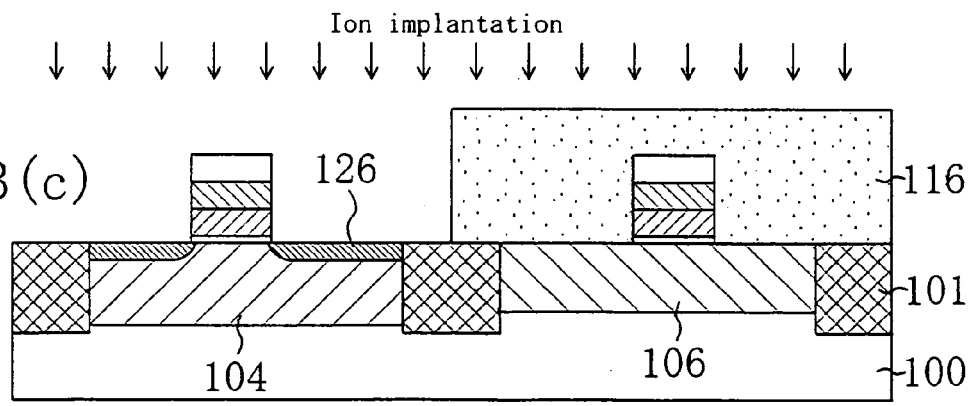
Figure 23D:
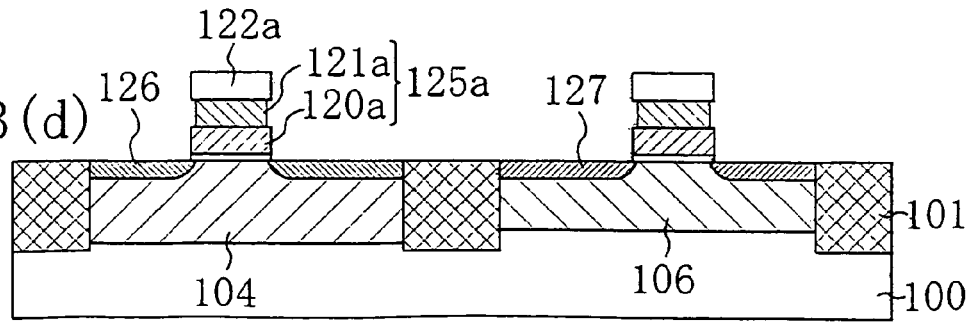

FIGS. 20(a) through 20(c) are sectional views for showing part of procedures for forming a trench isolation region of a semiconductor device according to Embodiment 4.

In the procedure shown in FIG. 20(a), after depositing a pad oxide film 41 and a masking nitride film 42 on a Si substrate 11, a photoresist film (not shown) having an opening on an area where a trench is to be formed is formed by the photolithography, so as to etch a portion of the masking nitride film 42 above the area where the trench is to be formed by using the photoresist film as a mask. Then, the photoresist film is removed, and dry etching is carried out by using the masking nitride film 42 as a mask, thereby forming a trench 43 in the Si substrate 11. Since portions of the pad oxide film 44 exposed on the sidewalls of the trench 43 are etched by the RCA cleaning and the etching with diluted hydrofluoric acid (BHF) conducted thereafter, the pad oxide film 41 sinks to form a gap 44.

Next, in the procedure shown in FIG. 20(b), the bias plasma oxidation is carried out for 5 minutes by using the plasma generation system shown in FIG. 1 in an atmosphere including oxygen at a substrate temperature of 180° C. and bias power of 1000 W. Through this bias plasma oxidation, an electric field relaxing oxide film 45 having a thickness of 10 nm within the trench is formed. An abrupt upper edge of the Si substrate 11 exposed within the trench 43 is rounded by this electric field relaxing oxide film 45, so as to suppress the breakdown of a gate insulating film and the hump characteristic derived from electric field collection of a MOSFET formed therein.

Then, in the procedure shown in FIG. 20(a), a CVD oxide film is deposited on the entire substrate and is then etched back, thereby filling the CVD oxide film within the trench. Thus, a trench isolation region 46 is formed.

Since the electric field relaxing oxide film 45 is formed by the bias plasma oxidation in this embodiment, it is not affected by the shapes of the pad oxide film and the masking nitride film differently from an oxide film obtained by the conventional thermal oxidation, and hence, the edge can be changed into a good round shape for relaxing the electric field. Furthermore, since the electric field relaxing oxide film 45 is formed by the bias plasma oxidation conducted at a low temperature of 200° C. or less, the stress derived from the formation of the oxide film 45 can be suppressed from occurring. Accordingly, defects such as displacement in the Si substrate 11 can be prevented from occurring.

Alternatively, additional oxidation may be carried out by the thermal oxidation after forming the electric field relaxing oxide film 45 by the bias plasma oxidation before filling the trench with a CVD oxide film. Also in this case, the edge of the Si substrate 11 within the trench is rounded by the bias plasma oxidation, and hence, the additional oxidation by using the thermal oxidation never causes the hone phenomenon.

In each of the embodiments, the description has been given on merely oxidation (or nitriding oxidation) of a surface portion of a Si layer by the bias plasma oxidation, which does not limit the invention. For example, any of various semiconductor layers, such as a Ge layer, a SiGe layer, a SiGeC layer, a GaAs layer and an AlGaAs layer, can be subjected to the bias plasma oxidation to form an oxide or nitrided oxide film. Also in this case, the same effects as those attained in the embodiments can be exhibited.

Furthermore, a plasma oxide film may be formed after forming an STI groove in a SOI substrate.

What is claimed is:

1. A method of fabricating a semiconductor device comprising the steps of:
    (a) successively depositing a first insulating film and a conducting film at least including a metal on a semiconductor substrate;
    (b) patterning said conducting film and said first insulating film by etching with a photoresist film used as a mask into a gate electrode and a gate insulating film;
    (c) forming a second insulating film on at least an exposed portion of said semiconductor substrate through a reaction between oxygen and a semiconductor by subjecting, in an atmosphere including oxygen, said semiconductor substrate to plasma biased toward said semiconductor substrate, with said photoresist film kept;
    (d) removing said photoresist film; and
    (e) forming source/drain regions by introducing an impurity into regions positioned on both sides of said gate electrode in said semiconductor substrate.

2. The method of fabricating a semiconductor device of claim 1,
    wherein a polysilicon film and a metal film stacked thereon are formed as said conducting film in the step (a), a bottom electrode of a polysilicon film and a top electrode of a metal film are formed as said gate electrode in the step (b), and said second insulating film is formed also on side faces of said bottom electrode in the step (c).

3. The method of fabricating a semiconductor device of claim 2, wherein a silicon nitride film is further formed on said conducting film in the step (a), an over-gate protection film of a nitride film is formed on said top electrode in the step (b), and the method further includes, after the step (d), steps of:

(f) forming nitride film sidewalls on side faces of said polysilicon film and said metal film;

(g) depositing an interlayer insulating film of a silicon oxide film on said substrate; and (h) forming a contact hole penetrating through said interlayer insulating film and reaching said source/drain region in a self alignment manner against said gate electrode.

4. The method of fabricating a semiconductor device of claim 1, wherein the step (c) is carried out at a temperature of 200° or less.

* * * * *